(12) United States Patent
Amino et al.

(10) Patent No.: US 10,811,217 B2
(45) Date of Patent: Oct. 20, 2020

(54) CRYSTAL ORIENTATION FIGURE CREATING DEVICE, CHARGED PARTICLE BEAM DEVICE, CRYSTAL ORIENTATION FIGURE CREATING METHOD, AND PROGRAM

(71) Applicant: NIPPON STEEL CORPORATION, Tokyo (JP)

(72) Inventors: Takafumi Amino, Tokyo (JP); Takashige Mori, Tokyo (JP); Naoki Maruyama, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 0 days.

(21) Appl. No.: 16/489,268

(22) PCT Filed: Oct. 25, 2018

(86) PCT No.: PCT/JP2018/039705
§ 371 (c)(1),
(2) Date: Aug. 27, 2019

(87) PCT Pub. No.: WO2019/082976
PCT Pub. Date: May 2, 2019

(65) Prior Publication Data
US 2020/0066480 A1 Feb. 27, 2020

(30) Foreign Application Priority Data

Oct. 25, 2017 (JP) .................................. 2017-206457

(51) Int. Cl.
*H01J 37/20* (2006.01)
*H01J 37/22* (2006.01)
(Continued)

(52) U.S. Cl.
CPC .......... *H01J 37/20* (2013.01); *G01N 23/2251* (2013.01); *H01J 37/222* (2013.01);
(Continued)

(58) Field of Classification Search
CPC ........ H01J 37/20; H01J 37/222; H01J 37/265; H01J 37/28; H01J 2237/22; H01J 2237/2809; G01N 23/2251
(Continued)

(56) References Cited

U.S. PATENT DOCUMENTS

| 5,557,104 A | 9/1996 | Field et al. |
| 6,548,811 B1 * | 4/2003 | Nakamura ............ H01J 37/26 |
| | | 250/306 |

(Continued)

FOREIGN PATENT DOCUMENTS

| JP | 2003-121394 A | 4/2003 |
| JP | 2014-192037 A | 10/2014 |

(Continued)

OTHER PUBLICATIONS

"Application of SEM Method to Observation of Image of Dislocation in Steel Material", JEOL News (Japanese), 2011, vol. 43, pp. 7-12, total 8 pages.

(Continued)

*Primary Examiner* — Nicole M Ippolito
(74) *Attorney, Agent, or Firm* — Birch, Stewart, Kolasch & Birch, LLP

(57) ABSTRACT

There is provided a crystal orientation figure creating device for use in a charged particle beam device for making a charged particle beam irradiated to a surface of a sample, the crystal orientation figure creating device being configured to create a crystal orientation figure, which is a figure representing a crystal coordinate system of a crystal at a position selected on the surface with respect to an incident direction (Continued)

of the charged particle beam, the crystal orientation figure creating device including: an orientation information acquiring unit configured to acquire crystal orientation information with respect to the incident direction at the selected position; an incident direction information acquiring unit configured to acquire information relating to an incident direction of the charged particle beam with respect to the sample; and a crystal orientation figure creating unit configured to create a crystal orientation figure in a changed incident direction at the selected position, based on the crystal orientation information acquired by the orientation information acquiring unit, and the information relating to the incident direction at the time when the crystal orientation information is acquired and the information relating to the changed incident direction, acquired by the incident direction information acquiring unit.

16 Claims, 21 Drawing Sheets

(51) Int. Cl.
*H01J 37/26* (2006.01)
*H01J 37/28* (2006.01)
*G01N 23/2251* (2018.01)

(52) U.S. Cl.
CPC ............ *H01J 37/265* (2013.01); *H01J 37/28* (2013.01); *H01J 2237/22* (2013.01); *H01J 2237/2809* (2013.01)

(58) Field of Classification Search
USPC .................. 250/306, 307, 309, 310, 311
See application file for complete search history.

(56) References Cited

U.S. PATENT DOCUMENTS

| | | | |
|---|---|---|---|
| 2003/0130803 A1 | 7/2003 | Chou et al. | |
| 2012/0043463 A1* | 2/2012 | Agemura | H01J 37/26 250/310 |
| 2014/0291511 A1 | 10/2014 | Man et al. | |
| 2020/0066481 A1* | 2/2020 | Mori | H01J 37/28 |

FOREIGN PATENT DOCUMENTS

| | | |
|---|---|---|
| JP | 2016-139513 A | 8/2016 |
| JP | 2018-22592 A | 2/2018 |
| WO | WO 2015/121603 A1 | 8/2015 |

OTHER PUBLICATIONS

International Search Report for PCT/JP2018/039705 dated Jan. 29, 2019.
Sugiyama et al., "Application of Electron Channeling Contrast Imaging in a Scanning Electron Microscope for Dislocation Analysis", Kenbikyo, 2013, vol. 48, No. 3, pp. 216-220, total 6 pages.
Written Opinion of the International Searching Authority for PCT/JP2018/039705 (PCT/ISA/237) dated Jan. 29, 2019.

* cited by examiner

CRYSTAL ORIENTATION FIGURE CREATING DEVICE, CHARGED PARTICLE BEAM DEVICE, CRYSTAL ORIENTATION FIGURE CREATING METHOD, AND PROGRAM

TECHNICAL FIELD

The present invention relates to a crystal orientation figure creating device, a charged particle beam device including the crystal orientation figure creating device, crystal orientation figure creating method, and a program.

BACKGROUND ART

A scanning electron microscope (SEM) is a device for observing a surface structure, crystal grains, and a dislocation occurring in proximity to a surface, and the like of a material by converging an accelerated electron beam into an electron beam flux, irradiating a sample surface with the electron beam flux while scanning periodically, detecting backscattered electrons and/or secondary electrons, etc. generated from a local region of the irradiated sample, and converting these electric signals into a microstructure image of the material.

The electron beam drawn in vacuum from an electron source is immediately accelerated with energy varied depending on an observation purpose, ranging from a low accelerating voltage of 1 kV or less to a high accelerating voltage of about 30 kV. The accelerated electron beam is then focused through magnetic field coils including condenser lenses, an objective lens, and the like into a nanoscale, ultra small spot size of the electron beam flux, which is deflected by deflection coils at the same time. In such a manner, the sample surface is scanned with the converged electron beam flux. Recently, an additional combination with an electric field coil has been in use for focusing an electron beam.

Because of its constraint on resolution, a main function of conventional SEMs has been to observe a surface structure of a sample with a secondary electron image and investigate chemical composition information on the sample with a backscattered electron image. In contrast, it has recently become possible to focus an accelerated electron beam into an ultra small spot size of several nanometers with its luminance being kept high, allowing very high resolution backscattered electron images and secondary electron images to be acquired.

A most prevalent method for observing a lattice defect is that under a transmission electron microscope (TEM). In addition to this, in even such a high-resolution SEM described above, however, it has become possible to use an electron channeling contrast imaging (ECCI) method, which effectively utilizes a backscattered electron image, to observe information on a lattice defect inside a sample only on a top surface (up to a depth of about 100 nm from a surface) of a crystalline material (see Non-Patent Documents 1 and 2).

LIST OF PRIOR ART DOCUMENTS

Patent Document

Patent Document 1: JP2016-139513A.
Patent Document 2: JP2018-022592A

Non Patent Document

Non-Patent Document 1: JEOL news (Japanese) Vol. 43, (2011) p. 7-12
Non-Patent Document 2: Kenbikyo Vol. 48, No. 3 (2013) p. 216-220

SUMMARY OF INVENTION

Technical Problem

In a crystalline material observed by the SEM-ECCI method, a large difference in brightness and darkness of an observation image occurs due to different crystal orientations. A specific crystal orientation gives a darkest observation image. Such a condition is called an electron channeling condition (hereafter, also referred to simply as a "channeling condition"). The channeling condition can be satisfied by adjusting an incident direction of an electron beam with respect to a sample.

In an SEM, a backscattered electron intensity depends on an angle formed by an incident electron beam and a predetermined crystal plane changes. When the angle formed by the incident electron beam and the predetermined crystal plane satisfy a specific condition, the incident electron beam may enter a crystal deeply and may be prevented from being reflected, and the backscattered electron intensity decreases to a minimum. This condition refers to the channeling condition.

Even under the same condition, however, a portion where a crystal plane is disarranged locally by a lattice defect such as a dislocation and a stacking fault reflects an electron beam partially, so that the backscattered electron intensity increases. As a result, a contrast between a background and the lattice defect is enhanced, and thus the lattice defect can be distinguished for observation.

Similarly, a lattice defect can be observed also under a TEM by performing the observation under a Bragg condition, where only a diffracted wave on a specific crystal plane is strongly excited. The Bragg condition is also satisfied by adjusting an incident direction of an electron beam with respect to a sample.

Among kinds of lattice defects, observation of dislocation is important for analyzing an elementary process of plastic deformation in a material. A dislocation may slide on a specific crystal plane in plastic deformation, and in addition, dislocations may slide on a crystal plane, coalescing to disappear or behaving as a new defect on the crystal plane. For that reason, analyzing an elementary process of plastic deformation in a material requires identifying a behavior of a dislocation, that is, characteristics of the dislocation.

A dislocation can be observed or cannot be observed in a specific channeling condition or a Bragg condition depending on characteristics of the dislocation. For this reason, in analyzing the characteristics of a dislocation, it is important to clarify what conditions allow observation of a dislocation that is to be analyzed and what conditions do not allow the observation, while adjusting an incident direction of an electron beam with respect to a sample.

To clarify what channeling condition or Bragg condition is satisfied when a dislocation is found during observation, it is necessary to grasp rotation tensor/parameters of crystal coordinate system to sample coordinate system (hereafter, referred to simply as "crystal orientation information").

SEMs are often equipped additionally with an electron backscatter diffraction (EBSD) device to analyze a crystal orientation, which enables EBSD patterns to be acquired. Then, from the acquired EBSD pattern, a crystal orientation at the time when the dislocation is observed can be determined.

Now, to acquire an EBSD pattern, a sample needs to be tilted as much as 70°. Geometric arrangements of a backscattered electron detector for acquiring a backscattered electron image using an SEM include a forward scattered mode in which the backscattered electron detector is arranged directly below an EBSD detector and a backscattered mode in which the backscattered electron detector is arranged directly below an electron gun. The forward scattered mode allows a backscattered electron image to be acquired with a sample tilted as much as 70°, whereas a high resolution image cannot be acquired in the forward scattered mode because a large aberration of an incident electron beam occurs.

On the other hand, the backscattered mode allows a high resolution image that reflects a lattice defect to be acquired, whereas a problem with the backscattered mode is that acquisition of a backscattered electron image cannot coincide with acquisition of an EBSD pattern through EBSD. Alternatively, a backscattered electron image and an EBSD pattern can be acquired alternately, but this requires a sample to be tilted greatly at every acquisition, which raises a problem in not only that a crystal grain to be measured may move out of a visual field but also that a work time for the acquisition becomes lengthy.

TEM does not allow an electron diffraction pattern containing crystal orientation information and an observation image to be acquired at the same time, either. Accordingly, to control an incident direction of electron beam with respect to a crystal coordinate system of a crystal to be measured, an intended orientation relationship has to be established by position alignment using an observation image and a check on a crystal orientation using an electron diffraction pattern at frequent intervals, which requires a lot of work for observation.

As seen from the above, normal usage of an SEM or a TEM involves a problem in that, for example, the observation of a lattice defect such as a dislocation and the determination of a crystal orientation cannot be performed simultaneously. That is, there is a problem in that the observation of a lattice defect such as a dislocation cannot be performed while displaying a crystal orientation figure, which is a figure representing a crystal coordinate system of a crystal to be measured with respect to an incident direction of a charged particle beam (e.g., an actually-measured EBSD pattern, electron channeling pattern, or electron diffraction pattern, as well as an indexed Kikuchi map (hereinafter, referred to simply as a "Kikuchi map"), a pole figure, an inverse pole figure, a stereographic projection of crystal plane, a schematic diagram of real lattice, and a calculated electron diffraction pattern, etc.), in synchronization with operations.

The present invention has an objective to provide a crystal orientation figure creating device, a charged particle beam device including the crystal orientation figure creating device, a crystal orientation figure creating method, and a program that enables a crystal orientation figure to be created whenever necessary after an incident direction is changed while measurement is conducted in a charged particle beam device such as an SEM, TEM, and scanning ion microscope (SIM), using any function provided by the charged particle beam device.

Solution to Problem

The present invention has been made to solve the problems described above.

A crystal orientation figure creating device according to an embodiment of the present invention is a device for use in a charged particle beam device for making a charged particle beam irradiated to a surface of a sample, the crystal orientation figure creating device being configured to create a crystal orientation figure, which is a figure representing a crystal coordinate system of a crystal at a position selected on the surface with respect to an incident direction of the charged particle beam, the crystal orientation figure creating device including:

an orientation information acquiring unit configured to acquire crystal orientation information with respect to the incident direction at the selected position;

an incident direction information acquiring unit configured to acquire information relating to an incident direction of the charged particle beam with respect to the sample; and a crystal orientation figure creating unit configured to create a crystal orientation figure in a changed incident direction at the selected position, based on:

the crystal orientation information acquired by the orientation information acquiring unit;

the information acquired by the incident direction information acquiring unit, the information relating to the incident direction at a time when the crystal orientation information is acquired; and the information acquired by the incident direction information acquiring unit after the incident direction is changed, the information relating to the changed incident direction.

In addition, a crystal orientation figure creating method according to an embodiment of the present invention is a method for use in a charged particle beam device for making a charged particle beam irradiated to a surface of a sample, the crystal orientation figure creating method being for creating a crystal orientation figure, which is a figure representing a crystal coordinate system of a crystal at a position selected on the surface with respect to an incident direction of the charged particle beam, the crystal orientation figure creating method including:

(a) a step of acquiring crystal orientation information with respect to the incident direction at the selected position;

(b) a step of acquiring information relating to an incident direction of the charged particle beam with respect to the sample; and (c) a step of creating a crystal orientation figure in a changed incident direction at the selected position, based on:

the crystal orientation information acquired in the step of (a);

the information acquired in the step of (b), the information relating to the incident direction at a time when the crystal orientation information is acquired; and the information acquired in the step of (b) after the incident direction is changed, the information relating to the changed incident direction.

In addition, a program according to an embodiment of the present invention is a program for use in a charged particle beam device for making a charged particle beam irradiated to a surface of a sample, the program being run on a computer to create a crystal orientation figure, which is a figure representing a crystal coordinate system of a crystal at a position selected on the surface with respect to an incident direction of the charged particle beam, the program causing the computer to execute:

(a) a step of acquiring crystal orientation information with respect to the incident direction at the selected position;

(b) a step of acquiring information relating to an incident direction of the charged particle beam with respect to the sample; and (c) a step of creating a crystal orientation figure in a changed incident direction at the selected position, based on:

the crystal orientation information acquired in the step of (a);

the information acquired in the step of (b), the information relating to the incident direction at a time when the crystal orientation information is acquired; and the information acquired in the step of (b) after the incident direction is changed, the information relating to the changed incident direction.

Advantageous Effects of Invention

According to the present invention, it is possible to create a crystal orientation figure with a changed incident direction whenever necessary while measurement is conducted in a charged particle beam device such as an SEM, TEM, and SIM, using any function provided by the charged particle beam device.

DESCRIPTION OF EMBODIMENTS

A crystal orientation figure creating device, a charged particle beam device, a crystal orientation figure creating method, and a program according to an embodiment of the present invention will be described with reference to FIGS. 1 to 29.

[Configuration of Crystal Orientation Figure Creating Device]

Figure 1:
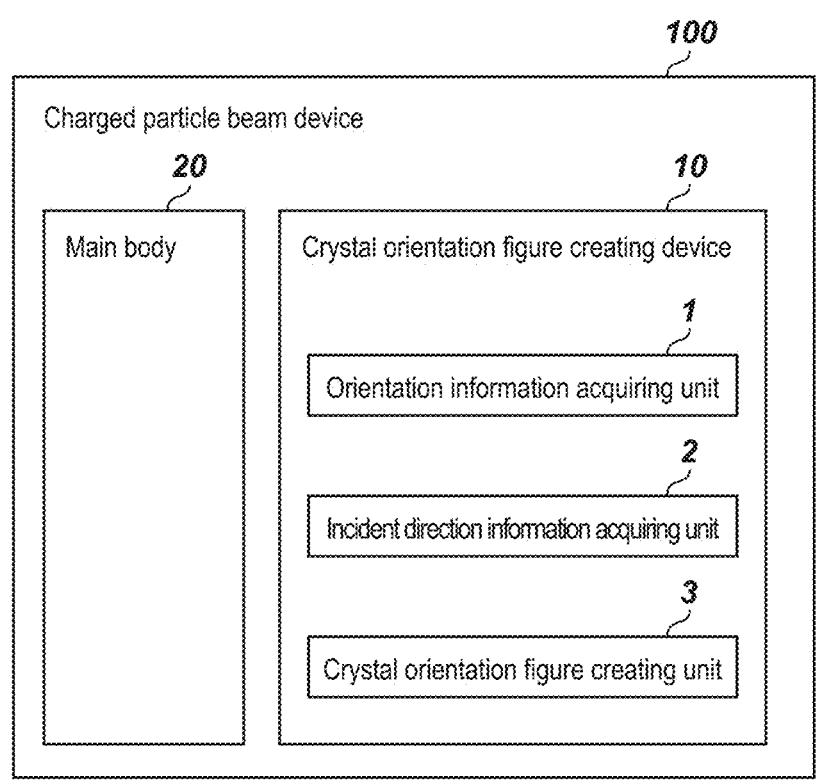
FIG. 1 is a diagram illustrating a schematic configuration of a crystal orientation figure creating device according to an embodiment of the present invention.

FIG. 1 is a diagram illustrating a schematic configuration of a charged particle beam device including a crystal orientation figure creating device according to an embodiment of the present invention. A crystal orientation figure creating device 10 according to an embodiment of the present invention is a device for use in a charged particle beam device 100 for making a charged particle beam irradiated to a surface of a sample, the device being configured to create a crystal orientation figure of a crystal (also referred to herein as a "crystal A") at a position selected on the surface (also referred to herein as a "position A").

Examples of the charged particle beam include an electron beam, a focused ion beam (FIB), atomic clusters carrying electric charge such as argon clusters, a positron beam, and the like. In addition, examples of the charged particle beam device 100 include an SEM, TEM, SIM, and the like.

In the example illustrated in FIG. 1, the crystal orientation figure creating device 10 is included in the charged particle beam device 100 but may be built in a general-purpose computer that is not connected to the charged particle beam device 100. In addition, the crystal orientation figure creating device 10 may be directly incorporated into the charged particle beam device 100, or may be built in a general-purpose computer connected to the charged particle beam device 100.

Figure 2:
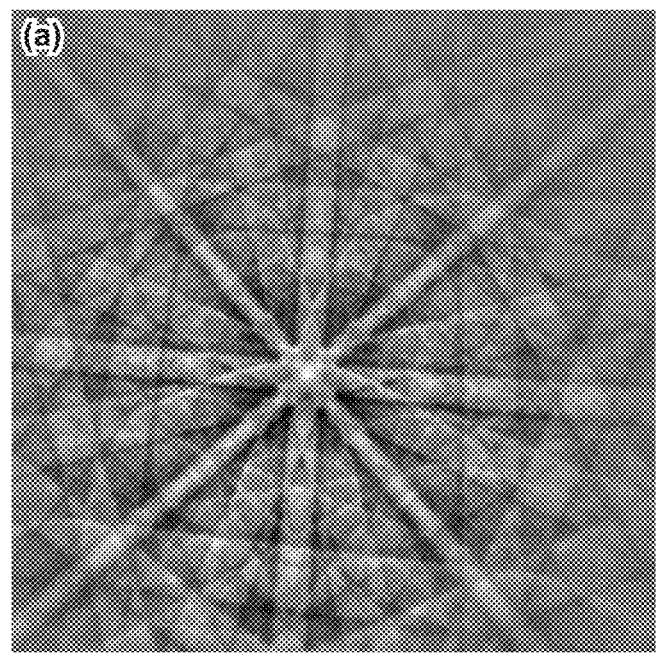
FIG. 2 is a diagram illustrating an example of crystal orientation figures.
Figure 2:
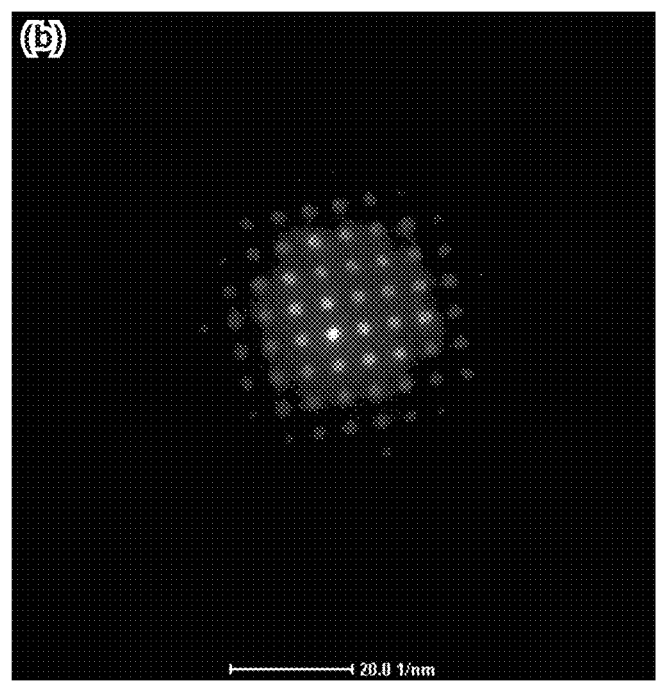
Figure 3:
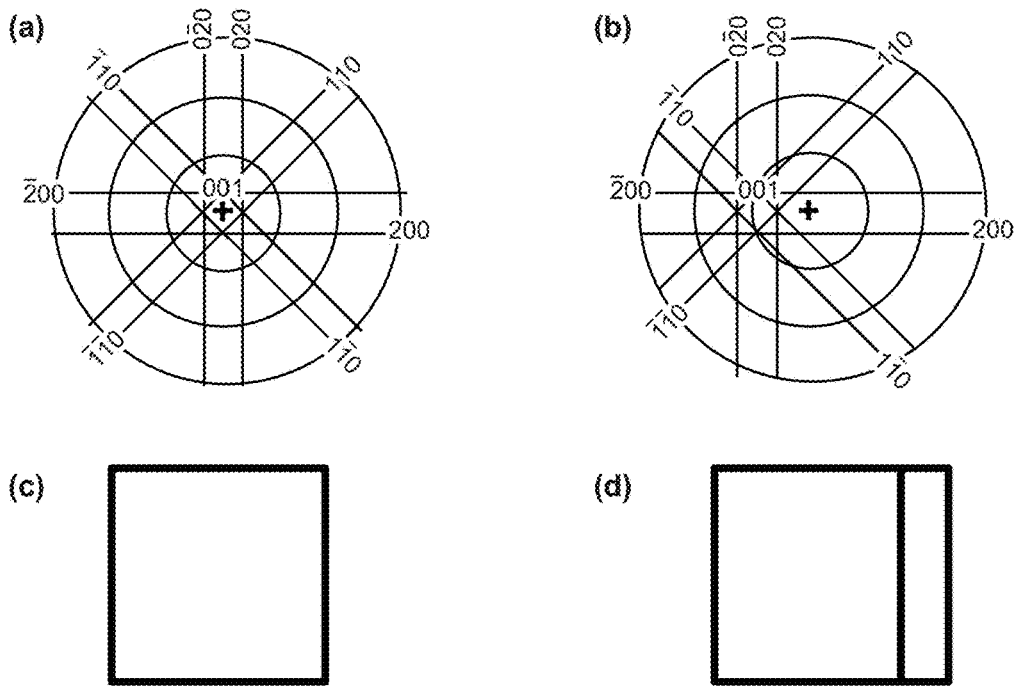
FIG. 3 is a diagram illustrating an example of crystal orientation figures.
Figure 4:
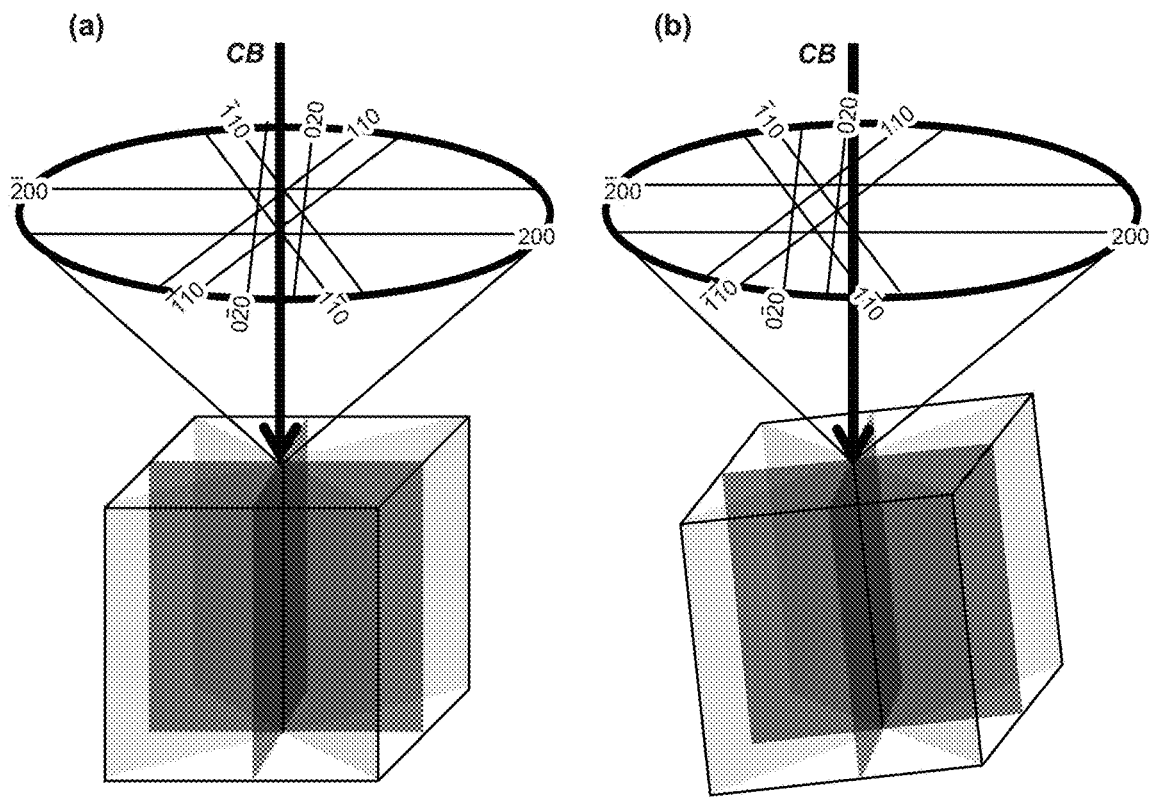
FIG. 4 is a conceptual diagram used for describing a correspondence between a Kikuchi map and a schematic diagram of real lattice.

As described above, the crystal orientation figure is a diagram representing a crystal coordinate system of a crystal to be measured with respect to an incident direction of a charged particle beam, that is, the crystal A. An example of crystal orientation figures is illustrated in FIGS. 2 and 3. FIG. 2(a) is an example of an EBSD pattern that is actually measured by EBSD, and FIG. 2(b) is an example of an electron diffraction figure that is actually measured under a TEM. FIGS. 3a and 3b are diagrams illustrating an example of Kikuchi maps, and FIGS. 3c and 3d are diagrams illustrating an example of schematic diagrams of real lattices. FIG. 4 is a conceptual diagram used for describing correspondences between Kikuchi maps and schematic diagrams of real lattices.

In a state illustrated in FIGS. 3a, 3c, and 4a, a direction of a [001] zone axis included in a crystal is parallel to an incident direction of a charged particle beam CB. The incident direction of the charged particle beam CB is indicated in FIGS. 3a and 3b in a form of a cross illustrated in centers of the drawings, and the incident direction of the charged particle beam CB in FIGS. 3c and 3d is a direction perpendicular to the paper. In contrast, when the crystal is rotated with respect to the incident direction of the charged particle beam CB as schematically illustrated in FIG. 4b, the Kikuchi map and the schematic diagram of real lattice change into a state illustrated in FIGS. 3b and 3d.

As illustrated in FIG. 1, the crystal orientation figure creating device 10 according to an embodiment of the present invention includes an orientation information acquiring unit 1, an incident direction information acquiring unit 2, and a crystal orientation figure creating unit 3.

The orientation information acquiring unit 1 acquires orientation information on the crystal A at the position A, with respect to the incident direction of the charged particle beam. As described above, the crystal orientation information refers to orientation information indicating a rotation of a crystal coordinate system with respect to the incident direction of the charged particle beam. The sample coordinate system here means a coordinate system fixed to a sample, and the crystal coordinate system is a coordinate system fixed to a crystal lattice.

The crystal orientation information can be acquired by conducting a point analysis, a mapping analysis, or other kinds of analyses using an electron diffraction method, an EBSD method, a transmission EBSD method, a TEM-automated crystal orientation mapping (TEM-ACOM), an electron channeling pattern (ECP), and the like.

The crystal orientation information may be obtained by measuring it using the charged particle beam device 100 including the crystal orientation figure creating device 10, or may be obtained by measuring it using an external device. The crystal orientation information is obtained by various detectors included in the charged particle beam device, which will be described later. The crystal orientation information includes numeric data containing orientation information indicating rotation of a crystal coordinate system to a sample coordinate system and image data on an actually-measured EBSD pattern, electron channeling pattern, or electron diffraction pattern.

The numeric data contains, for example, data on crystal orientations converted into rotation vectors such as Rodrigues vectors, data on crystal orientations converted into rotation matrices represented by Euler angles with respect to a virtual orthogonal coordinate system on a sample surface, and the like. The conversion into the numeric data may be performed by the orientation information acquiring unit 1 or may be performed by an external device. In the present invention, "numeric data" is supposed to mean data represented in a form of set of numeric values.

In contrast, the image data such as an actually-measured EBSD pattern, electron channeling pattern, and electron diffraction pattern can be captured using an EBSD, ECP, TEM, or the like. The image data may be a plurality of image data items captured in a predetermined region on a sample surface or may be one image data item captured at the position A. Examples of the image data include kinds of data in, for example, a bitmap format (BMP), JPEG format, GIF format, PNG format, TIFF format, and the like.

The position at which the crystal orientation information is obtained may be registered in advance or may be set such that a position conforming to a preregistered condition is selected automatically.

In addition, for example, the position at which the crystal orientation information is obtained may be selected on a crystal orientation map that represents crystal orientations relative to a measurement position in color tone and that is created in advance based on the numeric data converted into the above Euler angles or the like (an IPF map: Inverse Pole Figure map, hereafter, referred to also as an "IPF map").

As the crystal orientation map, use may be made of the IPF map, as well as a map in which colors tell different crystal phases, a map that illustrates grain boundaries based on orientation information, a map that illustrates a strain distribution obtained by differentiation of orientation difference between pixels, or the like.

How to select the position for obtaining the crystal orientation information is not limited to the example described above, and the position may be selected on an observation image in the charged particle beam device such as an SEM and TEM. Alternatively, the position for obtaining the crystal orientation information may be selected based on information obtained by analyzing an EBSD pattern, an electron channeling pattern, an electron diffraction pattern, or other patterns that are actually measured beforehand in a predetermined region of the sample surface.

The information contains, for example, information relating to image qualities of actually-measured EBSD patterns at measurement points, information on values of errors between the actually-measured EBSD pattern and a Kikuchi map that is created by calculating crystal orientations, the errors being calculated for every pixel, and the like.

A number of positions for obtaining the crystal orientation information is not limited to one. For example, the orientation information acquiring unit 1 may acquire pieces of crystal orientation information at a plurality of positions on a sample surface. There is also no limitation on how to select the above plurality of positions, and the plurality of positions may be selected from within the same crystal grain or may be selected from different crystal grains.

There is also no limitation on the incident direction of the charged particle beam at the time when the crystal orientation information is acquired, and the incident direction may be set as appropriate. For example, crystal orientation information measured in a state in which the incident direction of the charged particle beam is perpendicular to the sample surface can be acquired.

The incident direction information acquiring unit 2 acquires information relating to the incident direction of the charged particle beam with respect to a sample. The information relating to the incident direction of the charged particle beam with respect to the sample can be acquired from the charged particle beam device for measuring the crystal orientation information. From the charged particle beam device, for example, information relating to an irradiation direction of the charged particle beam or information relating to a tilting angle of a sample stage on which the sample is mounted can be acquired. The incident direction information acquiring unit 2 then acquires information relating to the incident direction at a time when the crystal orientation information is acquired.

When the incident direction of the charged particle beam is thereafter changed by, for example, an operation of the charged particle beam device by an operator, the incident direction information acquiring unit 2 further acquires information relating to a changed incident direction. The incident direction of the charged particle beam can be changed while, for example, the charged particle beam device is used to measure a charged particle beam image on the sample surface. Examples of the charged particle beam image include a backscattered electron image, a secondary electron image, a transmitted electron image, an SIM image, and an STEM image.

The crystal orientation figure creating unit 3 creates a crystal orientation figure in the changed incident direction at the position A (hereinafter, referred to also as a "changed crystal orientation figure"), based on the crystal orientation information acquired by the orientation information acquiring unit 1, and the information relating to the incident direction at the time when the crystal orientation information is acquired and information relating to the changed incident direction, which are acquired by the incident direction information acquiring unit 2.

In a case of using image data as the crystal orientation information, the changed crystal orientation figure may be created based on the image data itself, or the changed crystal orientation figure may be created based on image analysis results obtained by image analysis on the image data.

As seen from the above, the changed crystal orientation figure is created through calculation. There is no particular limitation on how to determine the changed crystal orientation figure through calculation. The crystal orientation information and the changed crystal orientation figure are associated with each other by, for example, a geometrical coordinate transformation using a rotation tensor.

The crystal orientation figure creating unit 3 may create a crystal orientation figure in a state before the incident direction is changed, that is, a state of the time when the crystal orientation information on the position A is acquired (hereinafter, referred to also as a "standard status"), based on the crystal orientation information acquired by the orientation information acquiring unit 1.

Having the above configuration, the crystal orientation figure creating device 10 becomes capable of creating the changed crystal orientation figure whenever necessary while, for example, measuring the charged particle beam image.

In the case where the pieces of crystal orientation information at the plurality of positions are acquired as described above, the crystal orientation figure creating unit 3 can create changed crystal orientation figures at the above plurality of positions.

For example, a lattice defect in a polycrystalline material such as a steel material can be formed also by deformation of the material or propagation of a crack and can propagate across a plurality of crystal grains. Such a case requires a lattice defect in a plurality of crystal grains to be observed at the same time. As described above, by creating the changed crystal orientation figures at the plurality of positions, it is possible to grasp orientation relationships between a plurality of crystal grains being observed and the charged particle beam at the same time.

Figure 5:
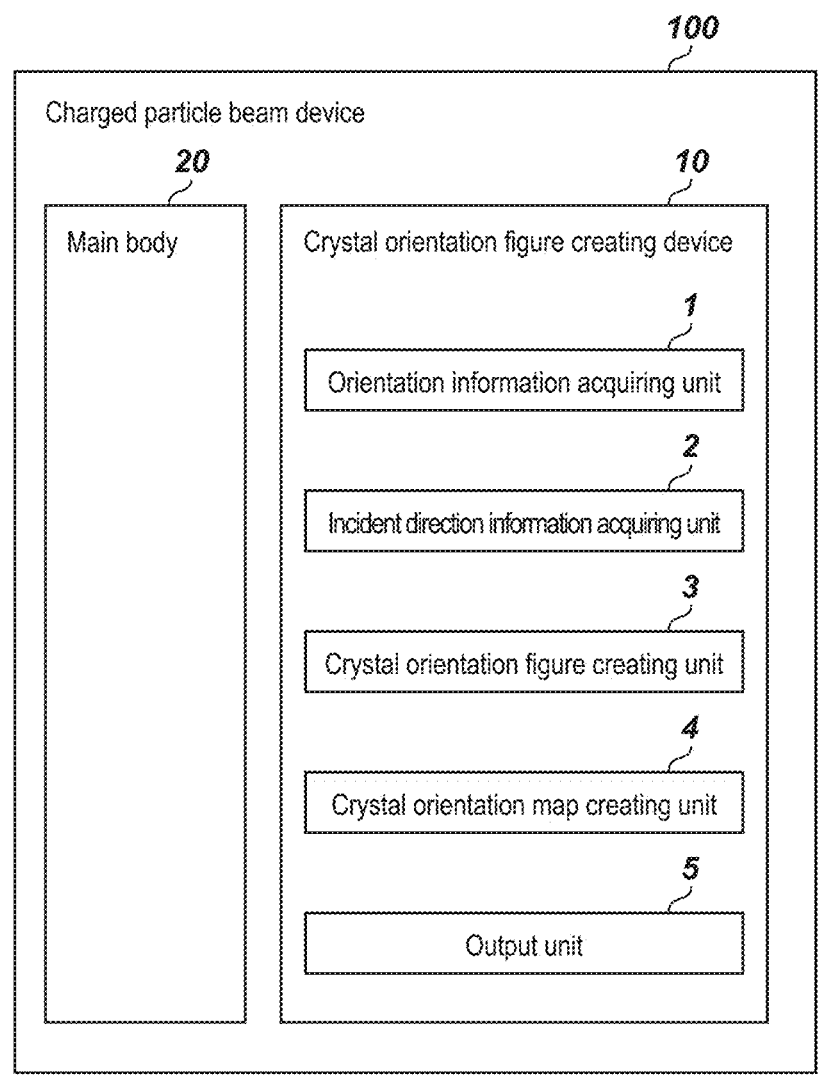
FIG. 5 is a diagram illustrating a schematic configuration of a crystal orientation figure creating device according to another embodiment of the present invention.

As illustrated in FIG. 5, the crystal orientation figure creating device 10 according to another embodiment of the present invention may further include a crystal orientation map creating unit 4. The crystal orientation map creating unit 4 creates an IPF map based on the crystal orientation information acquired by the orientation information acquiring unit 1, more specifically based on numerical data converted into the Euler angles or the like.

As illustrated in FIG. 5, the crystal orientation figure creating device 10 according to another embodiment of the present invention may further include an output unit 5. The output unit 5 outputs the changed crystal orientation figure at the position A created by the crystal orientation figure creating unit 3 so that the changed crystal orientation figure is displayed on an external display device.

In addition, the output unit 5 may output the charged particle beam image on the sample surface in the changed incident direction, the charged particle beam image being measured by the charged particle beam device and the changed crystal orientation figure at the position A, the changed crystal orientation figure being created by the crystal orientation figure creating unit 3 so that they are displayed at the same time on the external display device. At this point, the output unit 5 may output the charged particle beam image and the crystal orientation figure so that they are displayed at the same time on a single display device or so that they are displayed at the same time on different display devices.

As described above, the charged particle beam device 100 cannot measure the charged particle beam image at the same time with the crystal orientation figure. However, since the changed crystal orientation figure is created through calculation rather than actual measurement, and the output unit 5 can acquire and output the charged particle beam image and the crystal orientation figure at the same time. As a result, it becomes possible to refer to the changed crystal orientation figure whenever necessary while continuing observation of the sample surface with the charged particle beam image.

In addition to the charged particle beam image and the changed crystal orientation figure, the output unit 5 may output also the IPF map created by the crystal orientation map creating unit 4 such that the IPF map is displayed on the external display device at the same time.

In a case where the sample has properties of interacting with a magnetic field, such as magnetism and diamagnetism, the charged particle beam can be slightly inclined as the sample is tilted, under influence of the magnetic field. In such a case, a conceivable possibility is that there is a discrepancy between an actual changed crystal orientation figure and the changed crystal orientation figure created by the crystal orientation figure creating unit 3.

Hence, in a case of using a sample such as the above, it is preferable that the orientation information acquiring unit 1 acquires the crystal orientation information again every predetermined time period or every time the incidence angle of the charged particle beam changes by a predetermined amount.

[Configuration of Charged Particle Beam Device]

The charged particle beam device 100 according to an embodiment of the present invention includes the crystal orientation figure creating device 10 and a main body 20. A configuration of the charged particle beam device according to an embodiment of the present invention including the crystal orientation figure creating device will be described more specifically.

First, a case where an SEM 200 is used as the charged particle beam device 100 will be described as an example.

Figure 6:
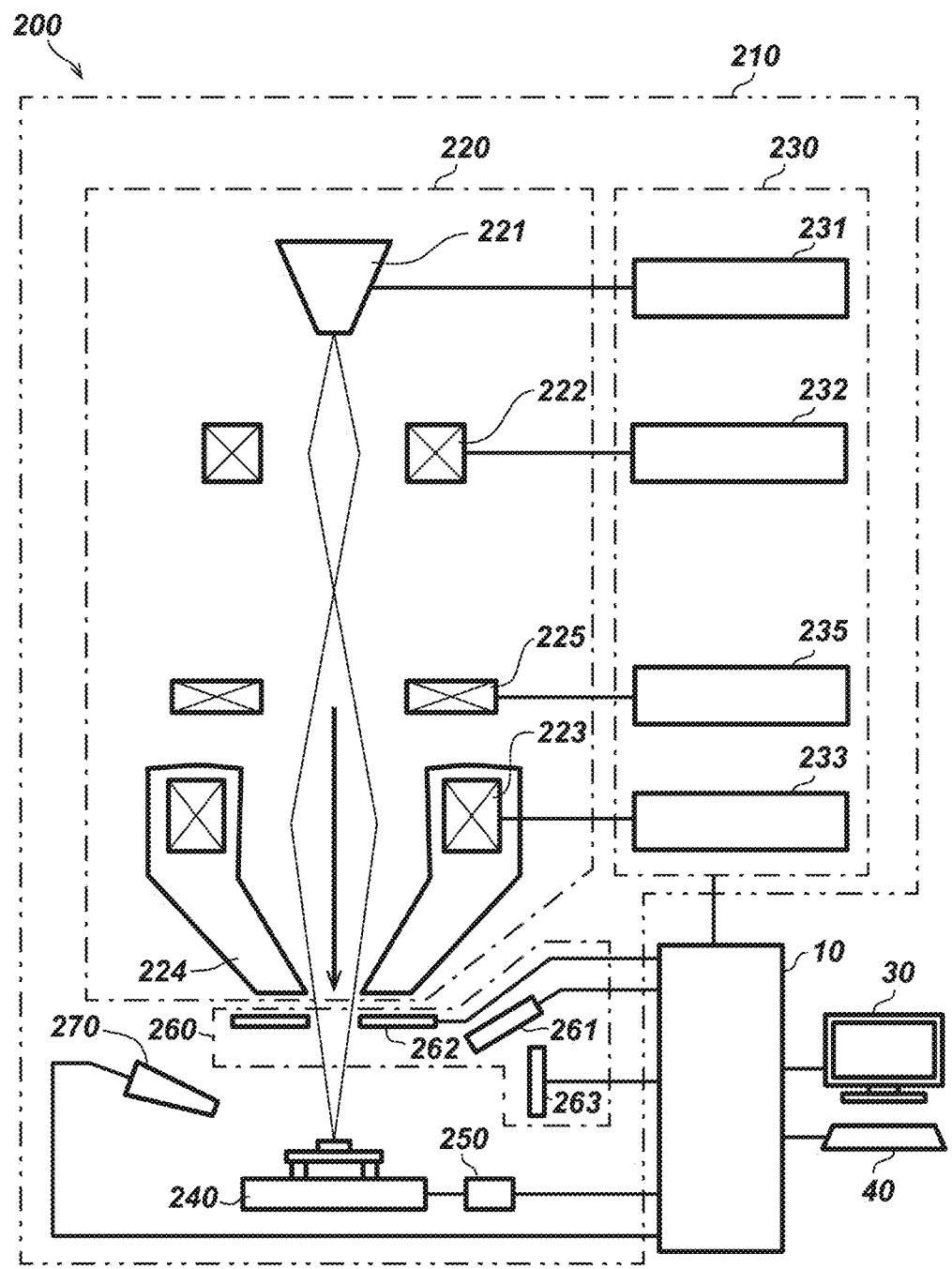
FIG. 6 is a diagram illustrating an example of an SEM schematically.

FIG. 6 is a diagram illustrating an example of the SEM 200 schematically. As illustrated in FIG. 6, the SEM 200 includes the crystal orientation figure creating device 10 and a main body 210. The main body 210 includes an electron beam irradiation device 220, an electron beam control device 230, a sample stage 240, a sample stage driving device 250, a detection device 260, and an FIB irradiation device 270.

The electron beam irradiation device 220 mainly includes an electron gun 221 configured to draw an electron beam from an electron source, and accelerate and emit the electron beam, a condenser lens 222 configured to focus an accelerated electron beam flux, an objective lens 223 configured to converge the focused electron beam flux within a micro region on the sample, a pole piece 224 including the objective lens, and a deflection coil 225 configured to scan the sample with the electron beam flux.

The electron beam control device 230 includes an electron gun control device 231, a focusing lens system control device 232, an objective lens system control device 233, and a deflection coil control device 235. The electron gun control device 231 is a device configured to control an acceleration voltage and the like for the electron beam emitted from the electron gun 221, and the focusing lens system control device 232 is a device configured to control an aperture angle and the like of the electron beam flux that is focused by the condenser lens 222.

The sample stage 240 is for holding a sample, and its tilting angle and a virtual three-dimensional-coordinate position can be freely changed by the sample stage driving device 250. The detection device 260 includes a secondary electron detector 261, a backscattered electron detector 262, and an electron backscatter diffraction (EBSD) detector 263.

The FIB irradiation device 270 is a device for irradiating an FIB to the sample. A known device can be employed for the FIB irradiation device 270, and detailed illustrations and description of a structure of the FIB irradiation device 270 will be omitted. As illustrated in FIG. 6, in a configuration in which the FIB irradiation device 270 is included in the SEM 200, the charged particle beam includes an electron beam irradiation from the electron beam irradiation device 220 and an FIB irradiation from the FIB irradiation device 270. In general, the incident direction of the FIB is inclined by 52°, 54°, or 90° with respect to the incident direction of the electron beam. The SEM 200 need not include the FIB irradiation device 270.

In the configuration, a charged particle beam image is obtained by the secondary electron detector 261 and the backscattered electron detector 262, and crystal orientation information is obtained by the electron backscatter diffraction detector 263. In addition, from setting values of the electron beam irradiation device 220, the electron beam control device 230, and the sample stage driving device 250, information relating to the incident direction of the electron beam with respect to the sample is obtained.

Figure 7:
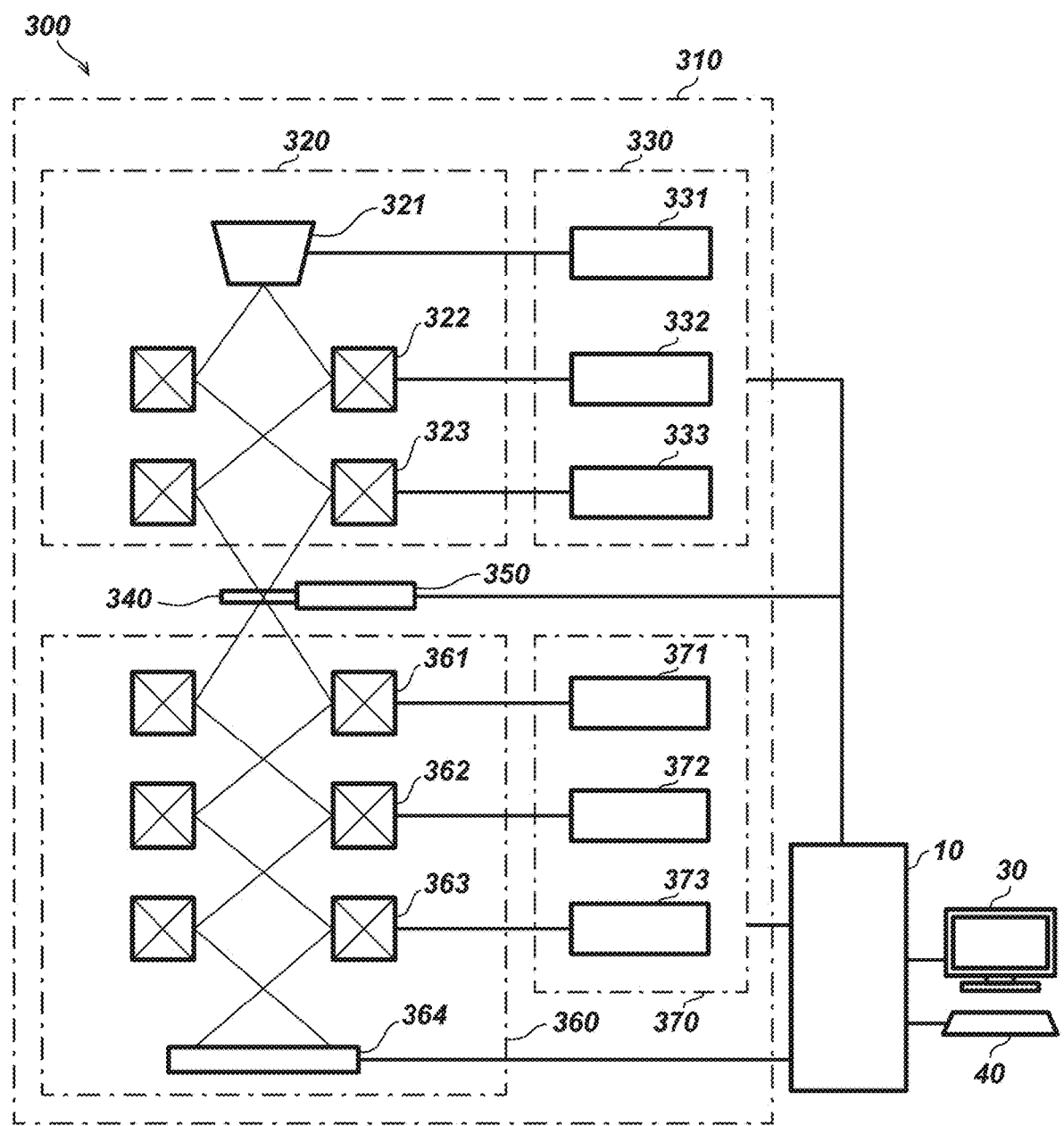
FIG. 7 is a diagram illustrating an example of a TEM schematically.

Next, a case where the charged particle beam device 100 is a TEM 300 will be described as an example. FIG. 7 is a diagram illustrating an example of the TEM 300 schematically. As illustrated in FIG. 7, a main body 310 of the TEM 300 includes an electron beam irradiation device 320, an electron beam control device 330, a sample holder 340, a sample holder driving device 350, a detection device 360, and a detection system control device 370.

The electron beam irradiation device 320 mainly includes an electron gun 321 configured to draw an electron beam from an electron source, and accelerate and emit the electron beam, a first condenser lens 322 and a second condenser lens 323 each configured to focus an accelerated electron beam flux.

The electron beam control device 330 includes an electron gun control device 331, a first condenser lens system control device 332, and a second condenser lens system control device 333. The electron gun control device 331 is a device configured to control an acceleration voltage of the electron beam emitted from the electron gun 321. The first condenser lens system control device 332 and the second condenser lens system control device 333 are devices configured to control an aperture angle and the like of the electron beam flux that is focused by the first condenser lens 322 and the second condenser lens 323, respectively.

The sample holder 340 is for holding a sample, and its tilting angle and a virtual three-dimensional-coordinate position can be freely changed by the sample holder driving device 350. The detection device 360 includes an objective lens 361, an intermediate lens 362, a projector lens 363, and a detector 364. The objective lens 361, the intermediate lens 362, and the projector lens 363 enlarges a transmission image and an electron diffraction pattern, which are projected to the detector 364.

The detection system control device 370 includes an objective lens control device 371, an intermediate lens control device 372, and a projector lens control device 373, which changes magnetic intensities of the objective lens 361, the intermediate lens 362, and the projector lens 363, respectively, so that the information input into the detector 364 can be switched between the transmission image and the electron diffraction pattern. In addition, by inserting a fluorescent screen (not illustrated) at a position front of the detector 364 in the incident direction of the electron beam or in place of the detector 364, it becomes possible to observe a transmission image or an electron diffraction pattern that is projected onto the fluorescent screen to be observed with the naked eye.

In the configuration, a charged particle beam image and crystal orientation information are obtained by detector 364. In addition, from setting values of the electron beam irradiation device 320, the electron beam control device 330, and the sample holder driving device 350, information relating to the incident direction of the electron beam with respect to the sample is obtained.

Next, operation of the crystal orientation figure creating device according to an embodiment of the present invention will be described with reference to FIGS. 8 to 28.

First Embodiment

Figure 8:
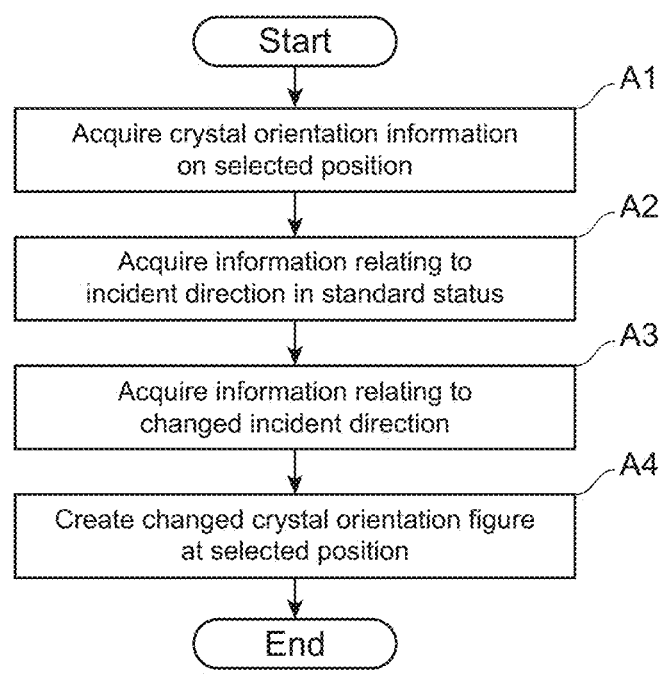
FIG. 8 is a flow chart illustrating operation of a crystal orientation figure creating device according to a first embodiment of the present invention.

FIG. 8 is a flow chart illustrating operation of a crystal orientation figure creating device according to a first embodiment of the present invention. In a crystal orientation figure creating method according to an embodiment of the present invention, first, the orientation information acquiring unit 1 acquires crystal orientation information on a position selected on a sample surface, with respect to an incident direction of a charged particle beam (step A1).

Next, the incident direction information acquiring unit 2 acquires information relating to the incident direction of the charged particle beam with respect to a sample in a standard status (step A2). When the incident direction of the charged particle beam is then changed by, for example, an operation by an operator, the incident direction information acquiring unit 2 further acquires information relating to the changed incident direction (step A3).

The crystal orientation figure creating unit 3 thereafter creates a changed crystal orientation figure at the selected position based on the crystal orientation information acquired in step A1, the information relating to the incident direction in the standard status and acquired in step A2, and the information relating to the changed incident direction and acquired in step A3 (step A4).

Second Embodiment

Figure 9:
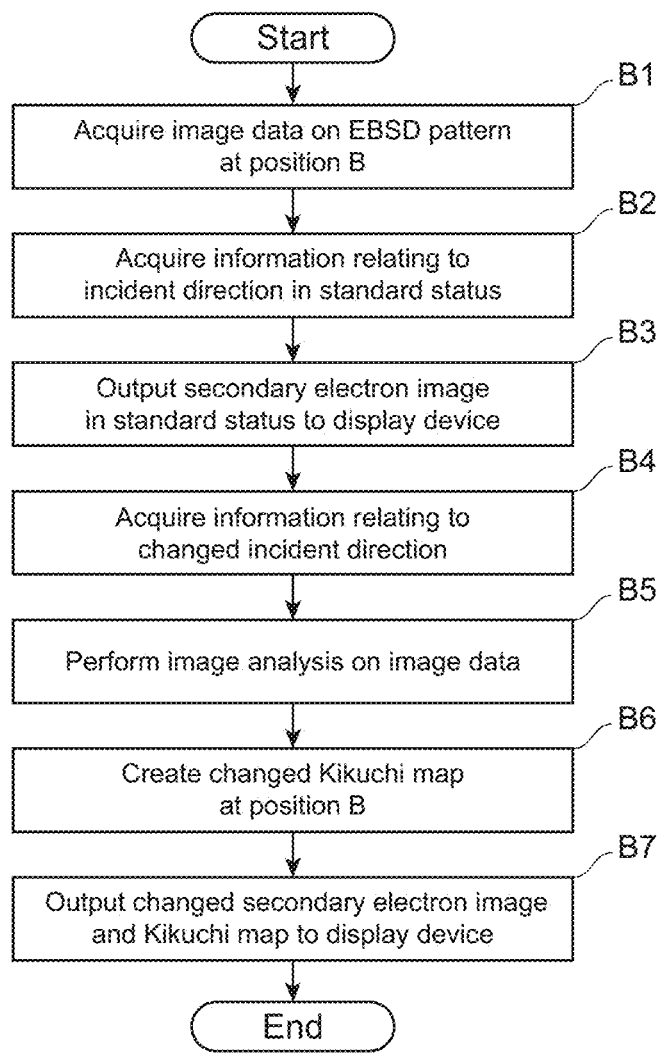
FIG. 9 is a flow chart illustrating operation of a crystal orientation figure creating device according to a second embodiment of the present invention.

FIG. 9 is a flow chart illustrating operation of a crystal orientation figure creating device according to a second embodiment of the present invention. In the embodiment to be described below, a case of using an SEM will be first described as an example.

As a precondition, point analysis using the EBSD method is conducted at a position selected on a sample surface by an operator (hereafter, referred to as a "position B"). In the use of the EBSD method, the analysis needs to be conducted with the sample tilted by about 70° from an initial status. After the analysis, a tilting angle of the sample is returned to the initial status.

Subsequently, as illustrated in FIG. 9, the orientation information acquiring unit 1 acquires image data on an EBSD pattern at the position B detected by the electron backscatter diffraction detector 63 (step B1). The incident direction information acquiring unit 2 then acquires information relating to an incident direction of the electron beam in the standard status (step B2).

Subsequently, the output unit 5 outputs a secondary electron image that is measured by the SEM 200 in the standard status to a display device 30 that is connected to the crystal orientation figure creating device 10 (step B3).

Thereafter, an operator changes the incident direction of the electron beam with respect to the sample surface while observing a surface structure of the sample with the secondary electron image displayed on the display device 30, and then the incident direction information acquiring unit 2 acquires information relating to the changed incident direction (step B4). The incident direction of the electron beam can be changed by inputting instructions using an input device 40 that is connected to the crystal orientation figure creating device 10.

Figure 10:
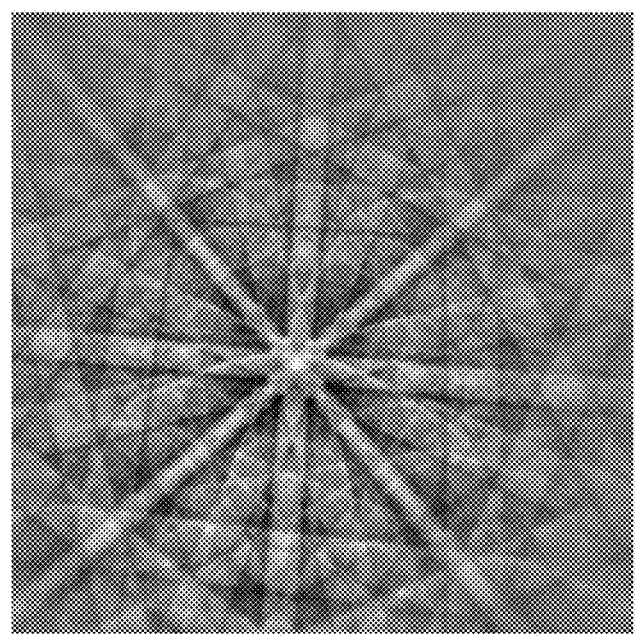
FIG. 10 is an image data on an EBSD pattern obtained in a standard status.
Figure 11:
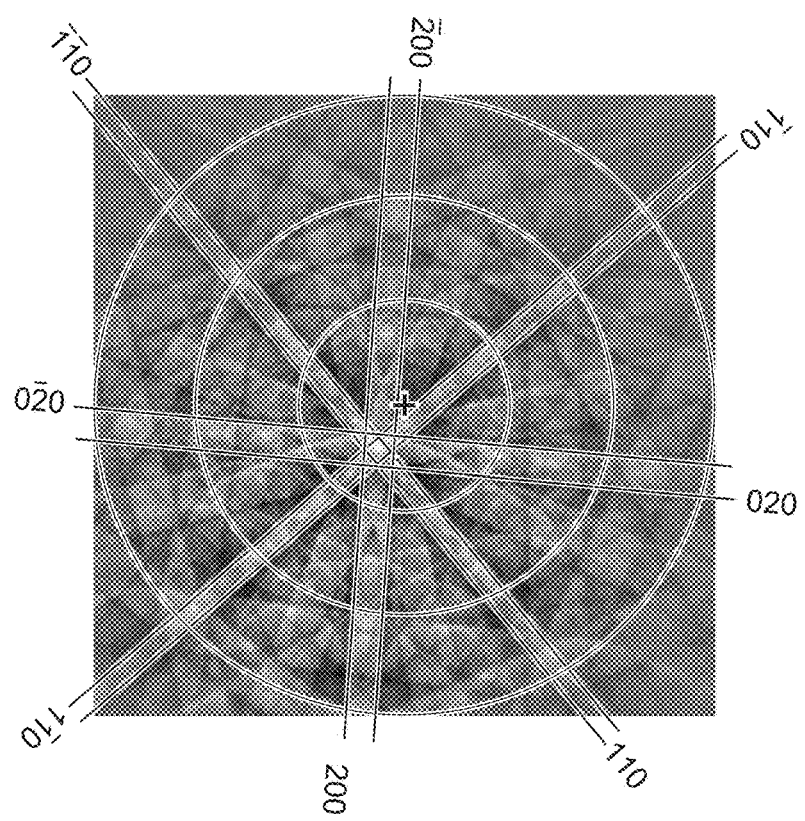
FIG. 11 is a diagram used for describing how to perform image analysis on image data on an EBSD pattern to obtain a Kikuchi map.
Figure 12:
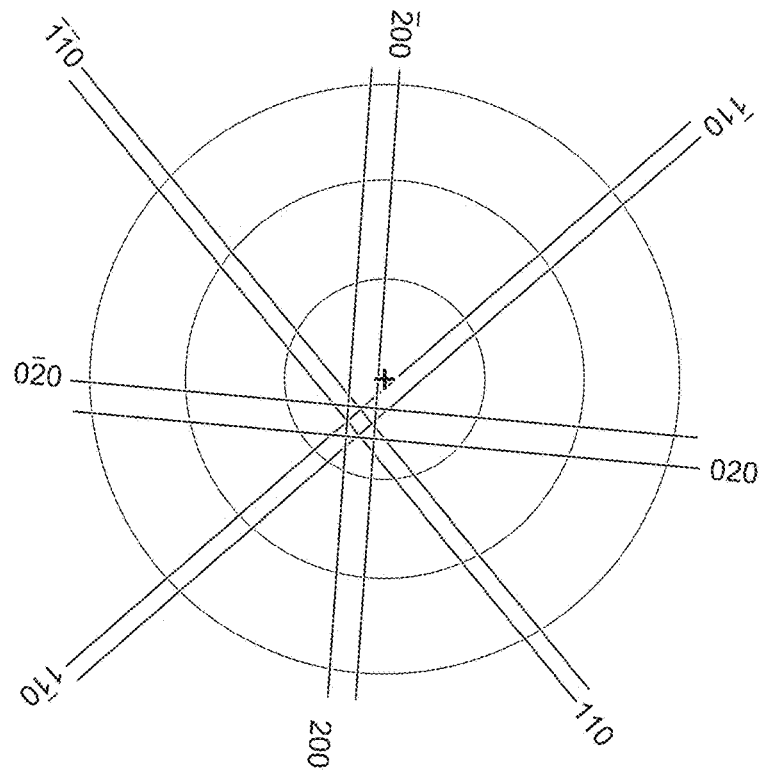
FIG. 12 is a diagram illustrating an example of a Kikuchi map in a standard status schematically.

Subsequently, the crystal orientation figure creating unit 3 performs image analysis on the image data acquired in step B1 (step B5). FIG. 10 is the EBSD pattern at the position B obtained by the EBSD method. In the present embodiment, the crystal orientation figure creating unit 3 performs the image analysis on the image data on this EBSD pattern and, and identifies Kikuchi lines corresponding to crystal planes as illustrated in FIG. 11, so as to obtain an indexed Kikuchi map as illustrated in FIG. 12.

Figure 13:
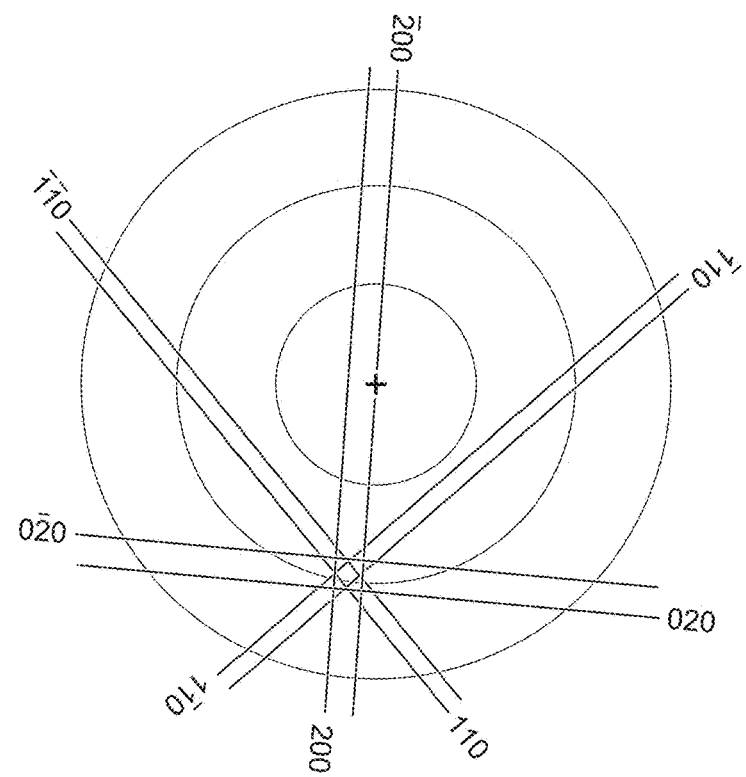
FIG. 13 is a diagram illustrating an example of a changed Kikuchi map schematically.

The crystal orientation figure creating unit 3 then creates a changed Kikuchi map (crystal orientation figure) at the position B as illustrated in FIG. 13 based on results of the image analysis obtained in step B5, the information relating to the incident direction in the standard status and acquired in step B2, and the information relating to the changed incident direction and acquired in step B4 (step B6).

The output unit 5 thereafter acquires the changed secondary electron image measured by the SEM 200 and the changed Kikuchi map, and outputs them such that they are displayed at the same time on the display device 30 (step B7).

This causes the changed secondary electron image and the changed crystal orientation figure to be displayed on the display device 30 at the same time. The creation of the changed crystal orientation figure and the output of the changed crystal orientation figure to the display device 30 may be performed according to an instruction from an operator, every predetermined interval, or continuously all the time.

Third Embodiment

Figure 14:
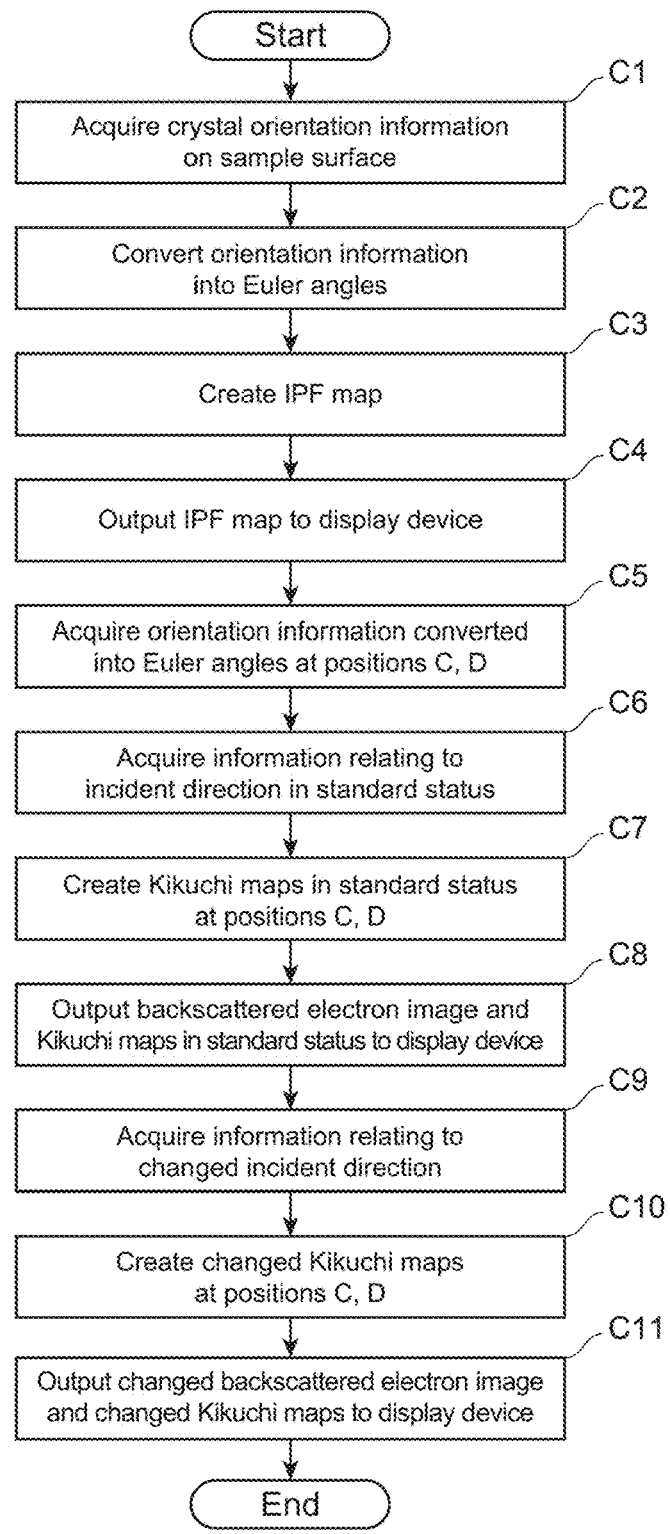
FIG. 14 is a flow chart illustrating operation of a crystal orientation figure creating device according to a third embodiment of the present invention.

In addition, a crystal orientation figure creating method according to another embodiment of the present invention will be described specifically with reference to FIG. 14. FIG. 14 is a flow chart illustrating operation of a crystal orientation figure creating device according to a third embodiment of the present invention.

As a precondition, mapping analysis using the EBSD method is conducted for a predetermined region on a sample surface. Subsequently, as illustrated in FIG. 14, the orientation information acquiring unit 1 acquires crystal orientation information on the sample surface detected by the electron backscatter diffraction detector 63 (step C1) and converts the orientation information into Euler angles with respect to a virtual orthogonal coordinate system on the sample surface (step C2).

Figure 15:
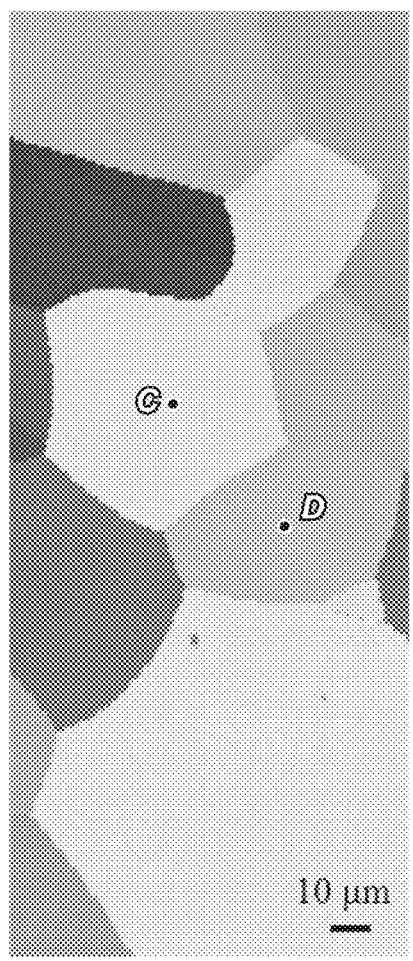
FIG. 15 is a diagram illustrating an example of an IPF map.

Subsequently, the crystal orientation map creating unit 4 creates an IPF map as illustrated in FIG. 15, based on the orientation information converted into the Euler angles (step C3). The output unit 5 then acquires the created IPF map and outputs the IPF map to the display device 30 (step C4). Then, the orientation information acquiring unit 1 acquires pieces of orientation information each converted into Euler angles at positions selected on the IPF map by an operator (positions indicated by black dots in FIG. 15, which will be hereafter referred to as a "position C" and a "position D") (step C5). As illustrated in FIG. 15, the position C and the position D lie in adjacent crystals.

Figure 16:
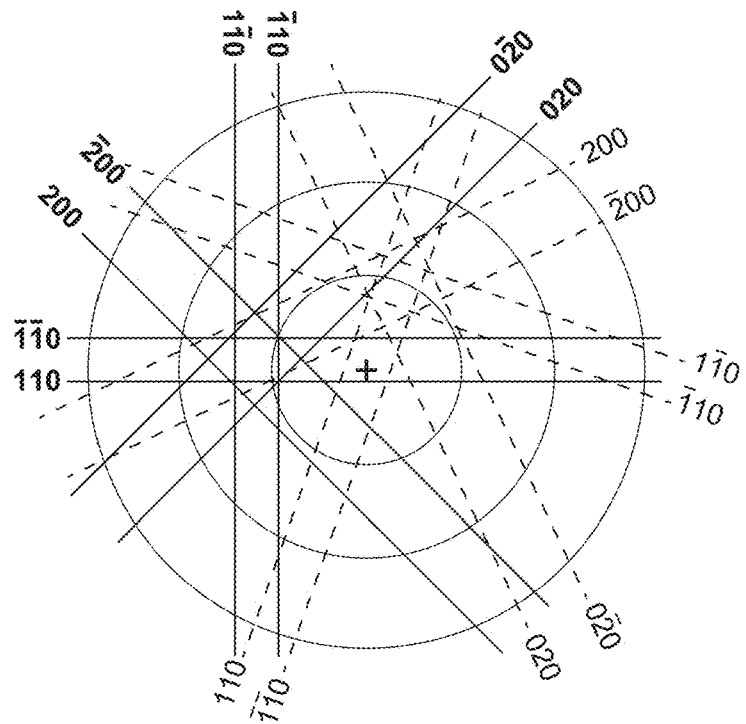
FIG. 16 is a diagram illustrating an example of two Kikuchi maps in a standard status schematically.

The incident direction information acquiring unit 2 then acquires information relating to an incident direction of the electron beam in the standard status (step C6). Subsequently, the crystal orientation figure creating unit 3 creates two Kikuchi maps in the standard status as illustrated in FIG. 16 based on the pieces of crystal orientation information acquired in step C5 (step C7). In an example illustrated in FIG. 16, a Kikuchi map at the position C is illustrated by solid lines, and a Kikuchi map at the position D is illustrated by broken lines.

Figure 17:
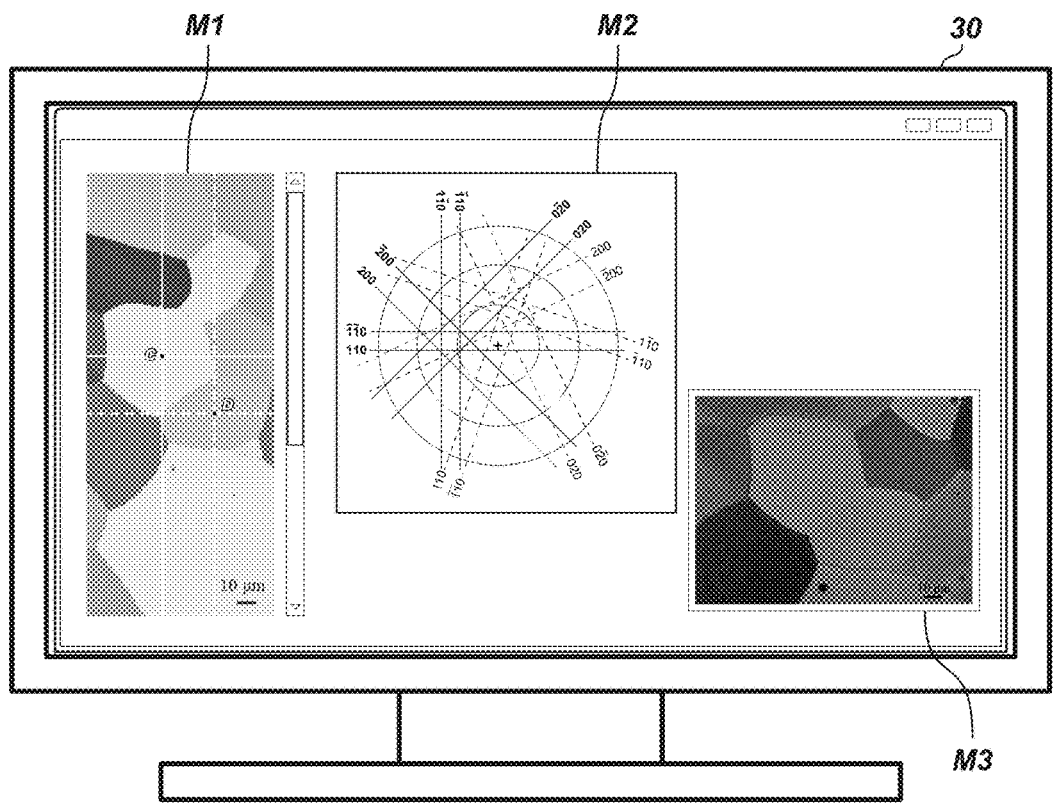
FIG. 17 is a diagram used for describing how an IPF map, as well as a backscattered electron image in a standard status and Kikuchi maps are displayed at the same time.

Subsequently, as illustrated in FIG. 17, the output unit 5 outputs an IPF map M1, as well as Kikuchi maps M2 in the standard status and a backscattered electron image M3 in the standard status measured by the SEM 200 such that they are displayed at the same time on the display device 30 (step C8). In the present embodiment, two Kikuchi maps are displayed in an overlapped manner.

Then, observing the backscattered electron image, the operator changes the incident direction of the electron beam with respect to the sample surface to make an adjustment such that the backscattered electron image becomes dim at the position C and the position D, that is, a channeling condition is satisfied.

Figure 18:
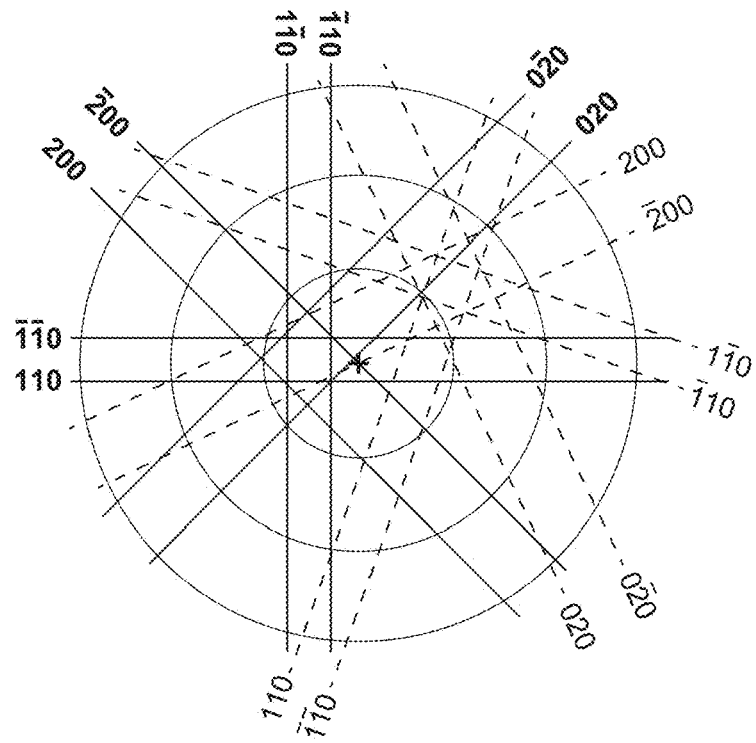
FIG. 18 is a diagram illustrating an example of two changed Kikuchi maps schematically.

Subsequently, the incident direction information acquiring unit 2 acquires information relating to a changed incident direction (step C9). The crystal orientation figure creating unit 3 then creates two changed Kikuchi maps (crystal orientation figures) at the position C and the position D as illustrated in FIG. 18 based on the pieces of orientation information on the position C and the position D each converted into the Euler angles and acquired in step C5, the information relating to the incident direction in the standard status and acquired in step C6, and the information relating to the changed incident direction and acquired in step C9 (step C10).

Figure 19:
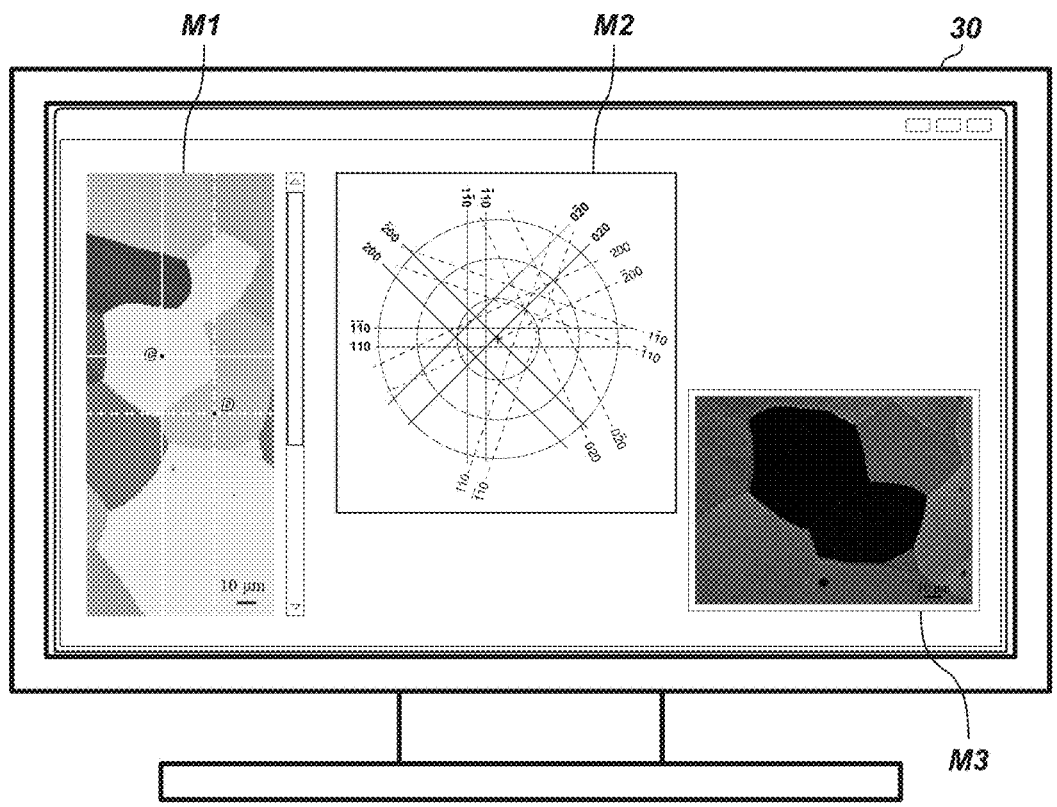
FIG. 19 is a diagram used for describing how an IPF map, as well as a changed backscattered electron image and Kikuchi maps are displayed at the same time.

The output unit 5 then outputs the IPF map M1, as well as the two changed Kikuchi maps M2 and the changed backscattered electron image M3 measured by the SEM 200 such that they are displayed at the same time on the display device 30, as illustrated in FIG. 19 (step C11).

Referring to the obtained Kikuchi maps, it is understood that the incident direction of the electron beam, a (−200) plane at the position C, and a (−200) plane at the position D satisfy the channeling condition. In the above state, a backscattered electron intensity is low in both crystals at the position C and the position D, and it is therefore possible to observe, for example, a dislocation that extends astride a boundary between two adjacent crystals.

With the backscattered electron image and the crystal orientation figure displayed on the display device 30 at the same time, it is possible to observe a dislocation while observing a crystal orientation.

Fourth Embodiment

Figure 20:
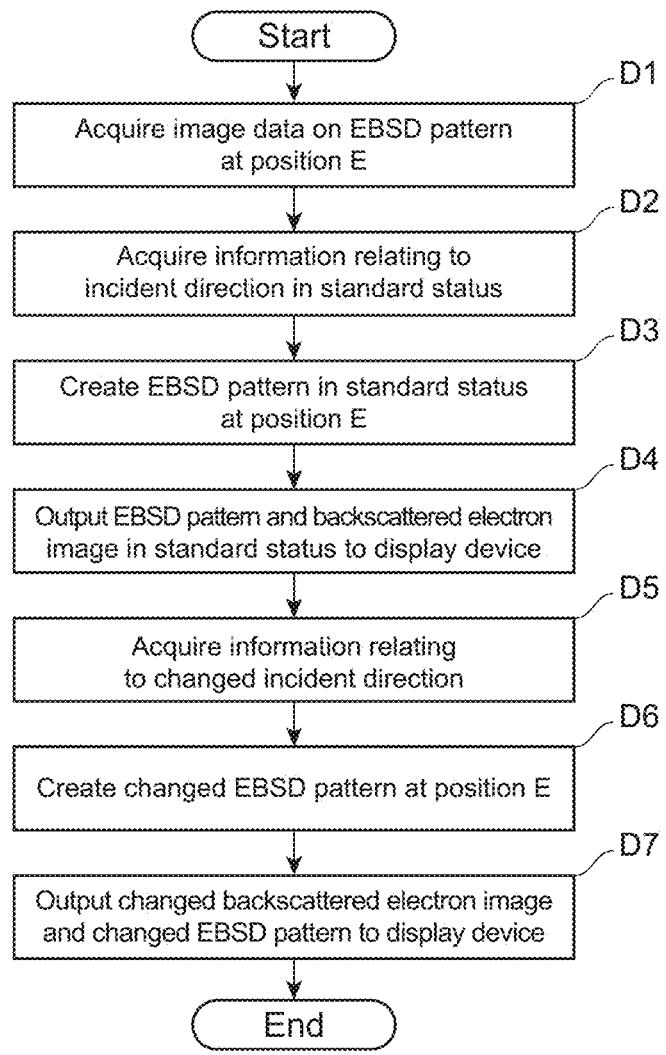
FIG. 20 is a flow chart illustrating operation of a crystal orientation figure creating device according to a fourth embodiment of the present invention.

A crystal orientation figure creating method according to another embodiment of the present invention will be described specifically with reference to FIG. 20. FIG. 20 is a flow chart illustrating operation of a crystal orientation figure creating device according to a fourth embodiment of the present invention.

As a precondition, point analysis using the EBSD method is conducted at a position selected on a sample surface by an operator (hereafter, referred to as a "position E"). In the use of the EBSD method, the analysis needs to be conducted with the sample tilted by about 70° from an initial status. After the analysis, a tilting angle of the sample is returned to that in the initial status.

Figure 21:
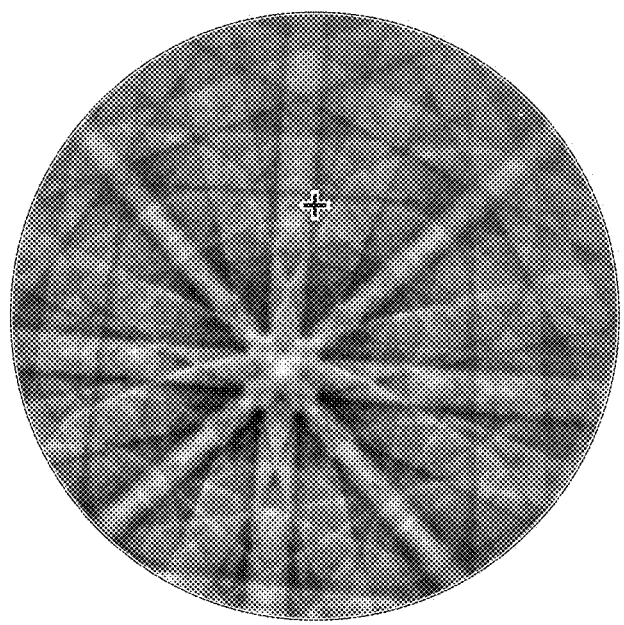
FIG. 21 is a diagram illustrating an example of an EBSD pattern in a standard status schematically.

Subsequently, as illustrated in FIG. 20, the orientation information acquiring unit 1 acquires image data on an EBSD pattern at the position E detected by the electron backscatter diffraction detector 63 (step D1). The incident direction information acquiring unit 2 then acquires information relating to an incident direction of the electron beam in the standard status (step D2). Thereafter, the crystal orientation figure creating unit 3 creates an EBSD pattern (crystal orientation figure) in the standard status as illustrated in FIG. 21 by cutting a required region from the image data acquired in step D1 (step D3).

Subsequently, the output unit 5 outputs the EBSD pattern in the standard status and a backscattered electron image that is measured by the SEM 200 in the standard status to the display device 30 that is connected to the crystal orientation figure creating device 10 (step D4).

Thereafter, an operator changes the incident direction of the electron beam with respect to the sample surface while observing the backscattered electron image displayed on the display device 30, and then the incident direction information acquiring unit 2 acquires information relating to the changed incident direction (step D5). The incident direction of the electron beam can be changed by inputting instructions using an input device 40 connected to the crystal orientation figure creating device 10.

Figure 22:
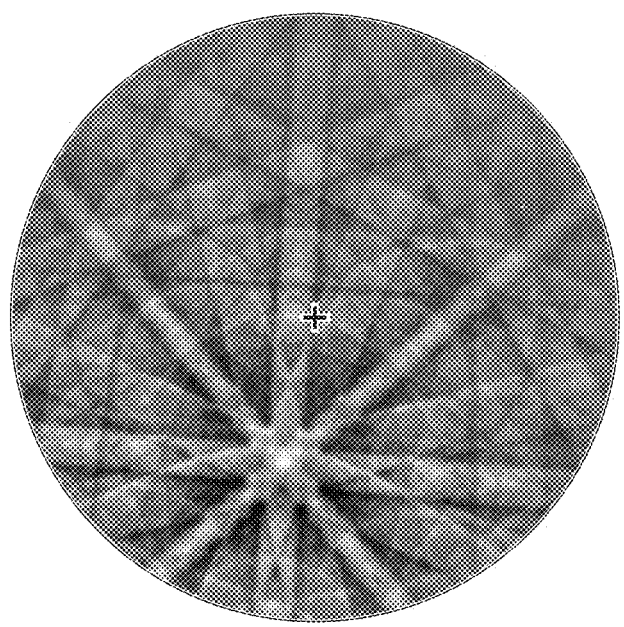
FIG. 22 is a diagram illustrating an example of a changed EBSD pattern schematically.

Subsequently, the crystal orientation figure creating unit 3 creates a changed EBSD pattern (crystal orientation figure) at the position E as illustrated in FIG. 22 based on the image data acquired in step D1, the information relating to the incident direction in the standard status and acquired in step D2, and the information relating to the changed incident direction and acquired in step D5 (step D6).

The output unit 5 thereafter acquires the changed backscattered electron image measured by the SEM 200 and the changed EBSD pattern, and outputs them such that they are displayed at the same time on the display device 30 (step D7).

This causes the changed backscattered electron image and the changed crystal orientation figure to be displayed at the same time all the time on the display device 30. The creation of the changed crystal orientation figure and the output of the changed crystal orientation figure to the display device 30 may be performed according to an instruction given from an operator, every predetermined interval, or continuously all the time.

The embodiments described above are described with the cases of using an SEM as an example but are not limited to these cases and hold true for a case of using a TEM.

Fifth Embodiment

Figure 23:
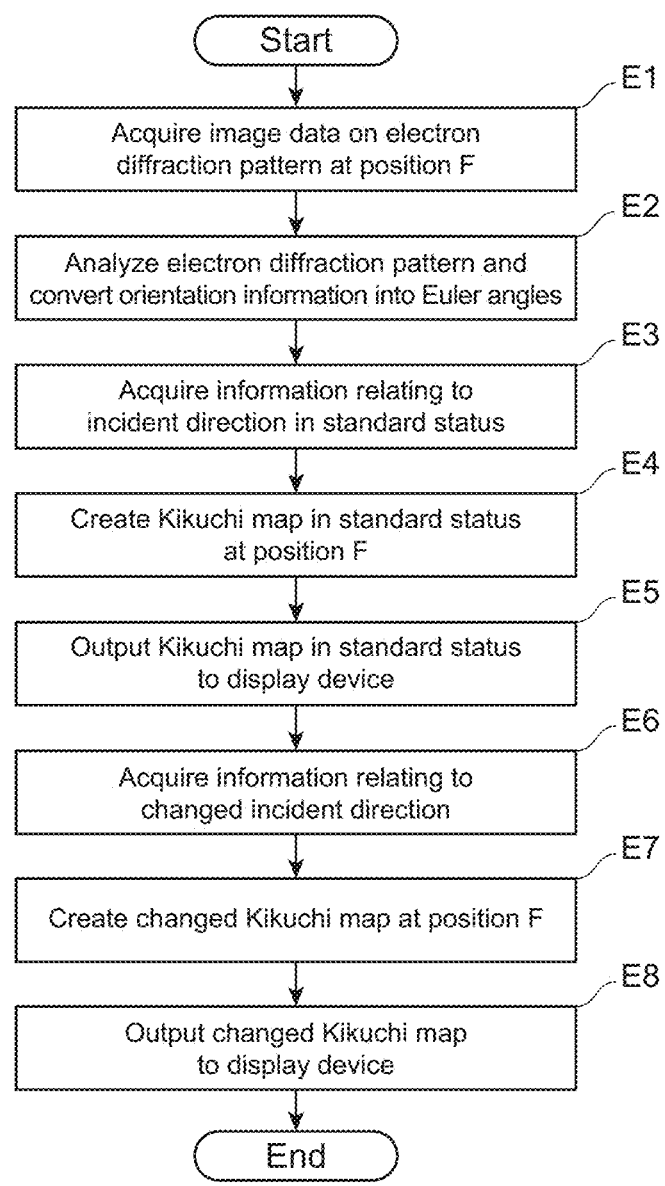
FIG. 23 is a flow chart illustrating operation of a crystal orientation figure creating device according to a fifth embodiment of the present invention.

Operation of a crystal orientation figure creating method according to another embodiment of the present invention will be described more specifically with reference to FIG. 23. FIG. 23 is a flow chart illustrating the operation of the crystal orientation figure creating device according to the fifth embodiment of the present invention.

A TEM provides not only information on an outermost surface of a sample but also information on an interior because the TEM takes an electron diffraction pattern and an image that are formed from an electron beam transmitted through a sample; however, an observation area of a TEM sample is typically a thin film having a thickness of several μm or less; therefore, use of the above-described term "sample surface" will continue.

As a precondition, TEM analysis is conducted at a position selected on a sample surface of a TEM sample by an operator (hereafter, referred to as a "position F"), in the standard status. Subsequently, as illustrated in FIG. 23, the orientation information acquiring unit 1 acquires image data on an electron diffraction pattern at the position F detected by the detector 364 (step E1) and analyzes the obtained image data on the electron diffraction pattern, converting the crystal orientation information on the sample surface into Euler angles (step E2). In a TEM, a tilting angle of a sample is common to measurement of a transmitted electron image and measurement of an electron diffraction pattern; therefore, an incident direction of a charged particle beam with respect to the sample in acquisition of the electron diffraction pattern forms the standard status.

Figure 24:
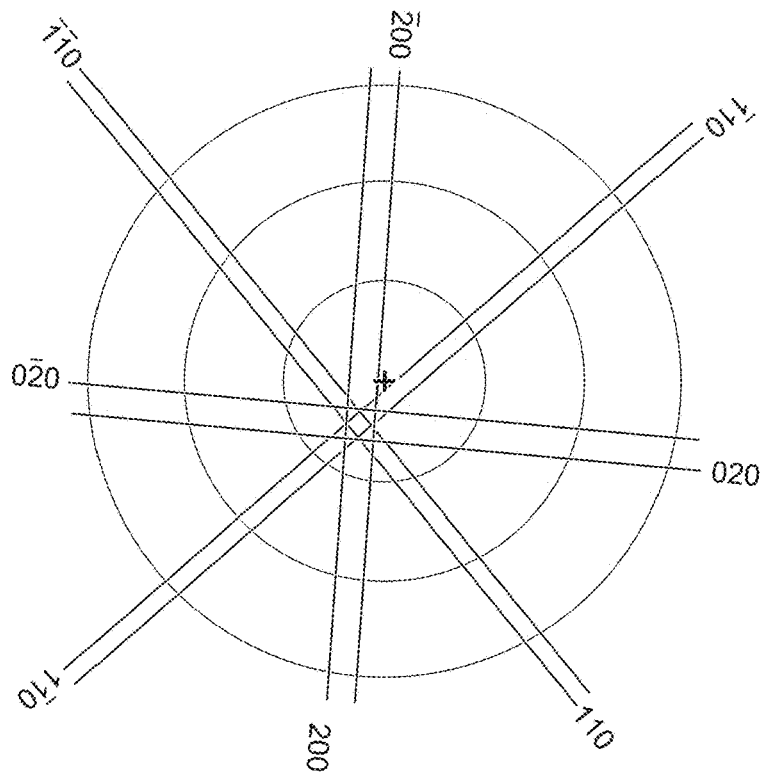
FIG. 24 is a diagram illustrating an example of a Kikuchi map in a standard status schematically.

The incident direction information acquiring unit 2 then acquires information relating to an incident direction of the electron beam in the standard status (step E3). Thereafter, the crystal orientation figure creating unit 3 creates a Kikuchi map in the standard status as illustrated in FIG. 24 based on the crystal orientation information acquired in step E2 (step E4).

Subsequently, the output unit 5 outputs the Kikuchi map in the standard status to the display device 30 that is connected to the crystal orientation figure creating device 10 (step E5). The transmitted electron image in the standard status is projected onto a fluorescent screen that is inserted in the TEM 300 for observation with the naked eye.

Thereafter, an operator changes the incident direction of the electron beam with respect to the sample surface while observing the transmitted electron image projected onto the fluorescent screen, and then the incident direction information acquiring unit 2 acquires information relating to the changed incident direction (step E6). The incident direction of the electron beam can be changed by inputting instructions using an input device 40 connected to the crystal orientation figure creating device 10.

Figure 25:
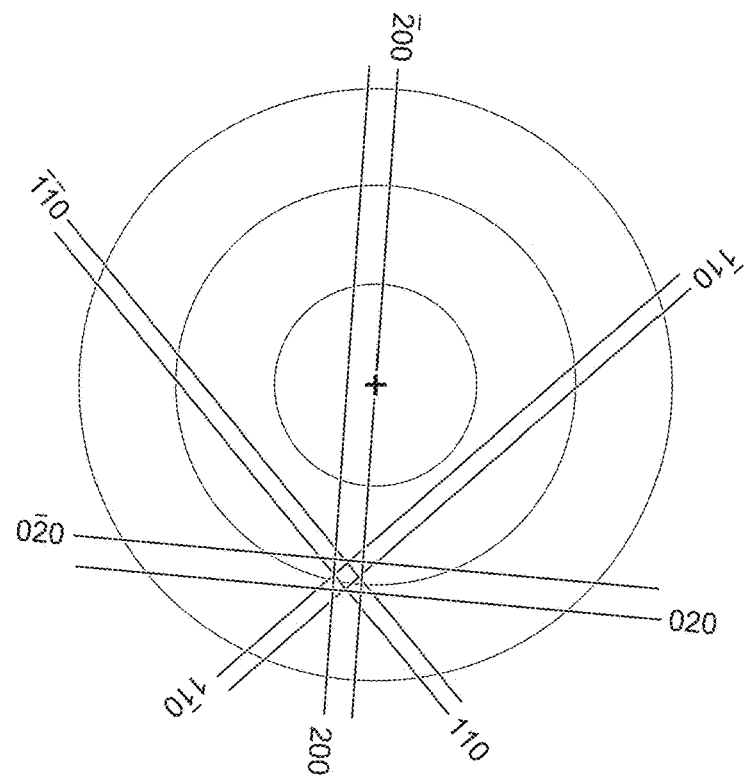
FIG. 25 is a diagram illustrating an example of a changed Kikuchi map schematically

Subsequently, the crystal orientation figure creating unit 3 creates a changed Kikuchi map (crystal orientation figure) at the position F as illustrated in FIG. 25 based on the orientation information on the position F converted into the Euler angles and acquired in step E2, the information relating to the incident direction in the standard status and acquired in step E3, and the information relating to the changed incident direction and acquired in step E6 (step E7).

The output unit 5 thereafter acquires the changed Kikuchi map, and outputs it such that it is displayed on the display device 30 (step E8). Also in this case, a changed transmitted electron image is projected onto the above fluorescent screen, allowing the observation with the naked eye.

This causes the crystal orientation figure to be displayed on the display device 30 with the changed transmitted electron image projected onto the fluorescent screen at the same time all the time. The creation of the changed crystal orientation figure and the output of the changed crystal orientation figure to the display device 30 may be performed according to an instruction given from an operator, every predetermined interval, or continuously all the time.

Sixth Embodiment

Figure 26:
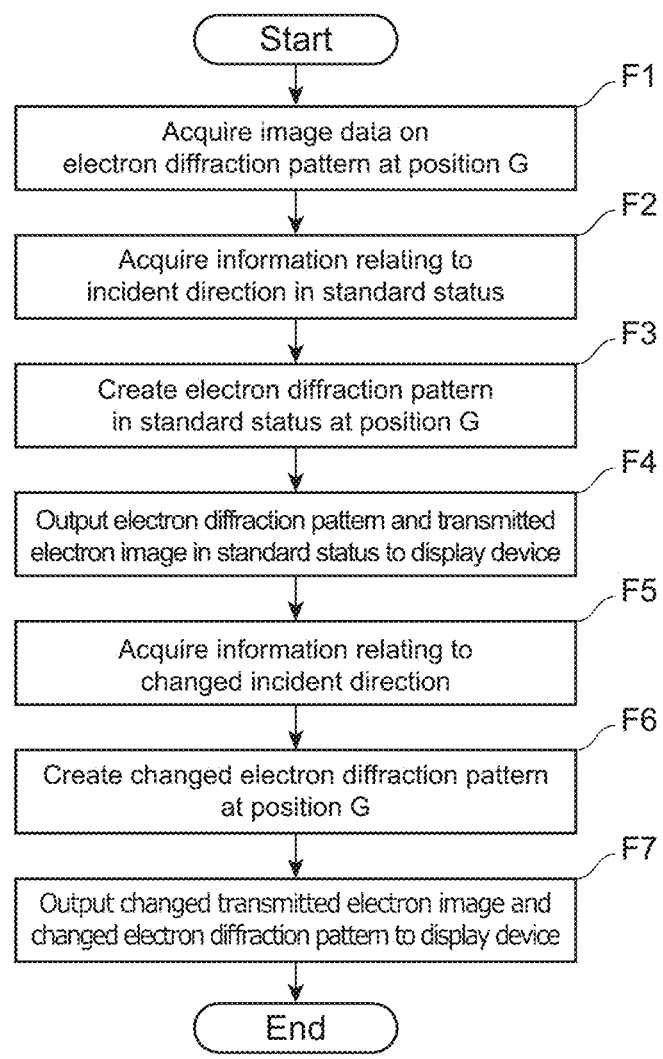
FIG. 26 is a flow chart illustrating operation of a crystal orientation figure creating device according to a sixth embodiment of the present invention.

A crystal orientation figure creating method according to another embodiment of the present invention will be described specifically with reference to FIG. 26. FIG. 26 is a flow chart illustrating operation of a crystal orientation figure creating device according to a sixth embodiment of the present invention.

As a precondition, TEM analysis is conducted at a position selected on a sample surface of a TEM sample by an operator (hereafter, referred to as a "position G"), in the standard status. Subsequently, as illustrated in FIG. 26, the orientation information acquiring unit 1 acquires image data on an electron diffraction pattern at the position G detected by the detector 364 (step F1).

Figure 27:
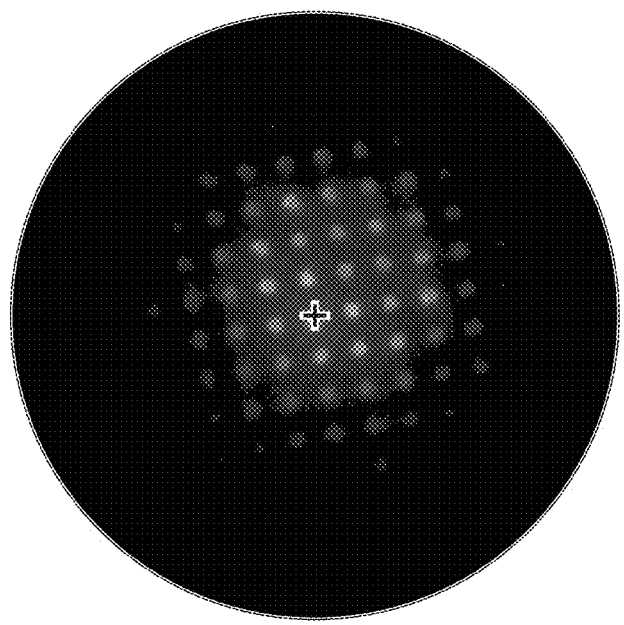
FIG. 27 is a diagram illustrating an example of an electron diffraction pattern in a standard status schematically.

The incident direction information acquiring unit 2 then acquires information relating to an incident direction of the electron beam in the standard status (step F2). Thereafter, the crystal orientation figure creating unit 3 creates an electron diffraction pattern (crystal orientation figure) in the standard status as illustrated in FIG. 27 by cutting a required region from the image data acquired in step F1 (step F3).

Subsequently, the output unit 5 outputs the electron diffraction pattern in the standard status and the transmitted electron image measured by the TEM 300 in the standard status to the display device 30 that is connected to the crystal orientation figure creating device 10 (step F4).

Thereafter, an operator changes the incident direction of the electron beam with respect to the sample surface while observing the transmitted electron image displayed on the display device 30, and then the incident direction information acquiring unit 2 acquires information relating to the changed incident direction (step F5). The incident direction of the electron beam can be changed by inputting instructions using an input device 40 connected to the crystal orientation figure creating device 10.

Figure 28:
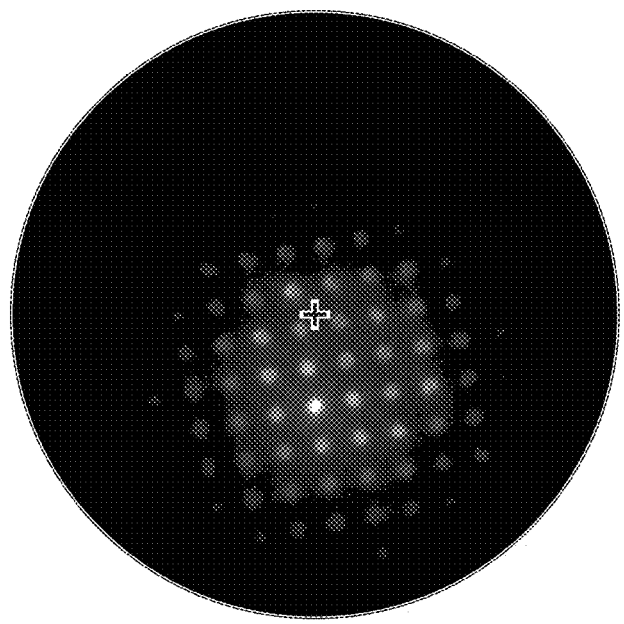
FIG. 28 is a diagram illustrating an example of a changed electron diffraction pattern schematically.

Subsequently, the crystal orientation figure creating unit 3 creates a changed electron diffraction pattern (crystal orientation figure) at the position G as illustrated in FIG. 28 based on the image data acquired in step F1, the information relating to the incident direction in the standard status and acquired in step F2, and the information relating to the changed incident direction and acquired in step F5 (step F6).

The output unit 5 thereafter acquires the changed transmitted electron image measured by the TEM 300 and the changed electron diffraction pattern, and outputs them such that they are displayed at the same time on the display device 30 (step F7).

This causes the changed transmitted electron image and the changed crystal orientation figure to be displayed at the same time on the display device 30. The creation of the changed crystal orientation figure and the output of the changed crystal orientation figure to the display device 30 may be performed according to an instruction given from an operator, every predetermined interval, or continuously all the time.

A program according to an embodiment of the present invention may be any program as long as it causes a computer to execute steps A1 to A4 illustrated in FIG. 8, steps B1 to B7 illustrated in FIG. 9, steps C1 to C11 illustrated in FIG. 14, steps D1 to D7 illustrated in FIG. 20, steps E1 to E8 illustrated in FIG. 23, or steps F1 to F7 illustrated in FIG. 26. The crystal orientation figure creating device 10 according to the present embodiment can be realized by installing the program in a computer and executing the program. In this case, a processor of the computer functions as the orientation information acquiring unit 1, the incident direction information acquiring unit 2, the crystal orientation figure creating unit 3, the crystal orientation map creating unit 4, and the output unit 5 to perform processing.

The program of the present embodiment may be executed by a computer system constructed from a plurality of computers. In this case, for example, each of the computers may function as any one of the orientation information acquiring unit 1, the incident direction information acquiring unit 2, the crystal orientation figure creating unit 3, the crystal orientation map creating unit 4, and the output unit 5.

Figure 29:
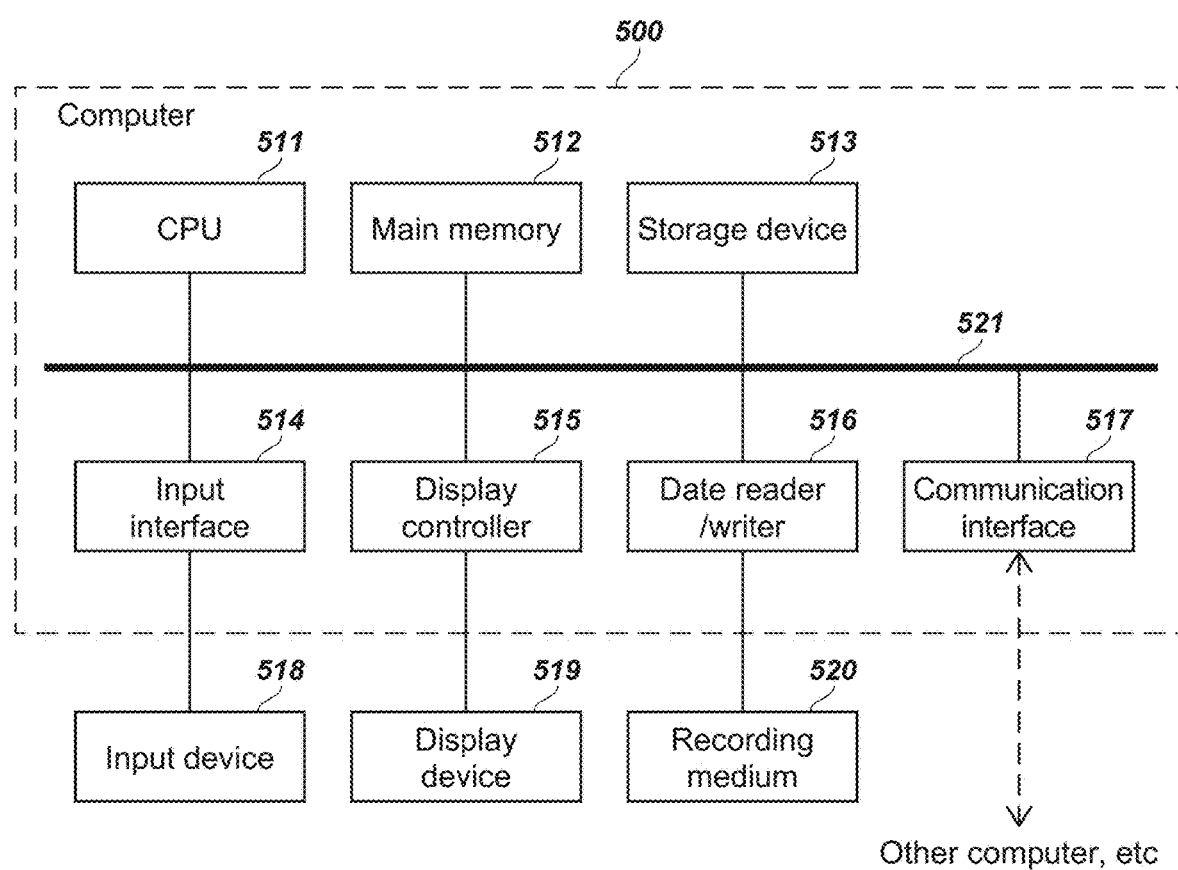
FIG. 29 is a block diagram illustrating an example of a computer that implements a crystal orientation figure creating device according to embodiments of the present invention.

A computer that realizes the crystal orientation figure creating device 10 by executing programs according to the first to sixth embodiments will be described with reference to FIG. 29. FIG. 29 is a block diagram illustrating an example of a computer realizing the crystal orientation figure creating device 10 according to the first to sixth embodiments of the present invention.

As illustrated in FIG. 29, a computer 500 includes a CPU (central processing unit) 511, a main memory 512, a storage device 513, an input interface 514, a display controller 515, a data reader/writer 516, and a communication interface 517. These components are connected to each other over a bus 521 such that they are able to perform data communication with each other. The computer 500 may include a GPU (graphics processing unit) or an FPGA (Field-Programmable Gate Array) in addition to or in place of the CPU 511.

The CPU 511 loads the programs (codes) according to the present embodiment, which is stored in the storage device 513, into the main memory 512, and executes the programs according to a prescribed sequence, thereby carrying out various types of operations. The main memory 512 is typically a volatile storage device such as DRAM (Dynamic Random Access Memory) or the like. In addition, the programs according to the present embodiment is stored in a computer-readable recording medium 520 and provided in such a state. Note that the program according to the present embodiment may be distributed over the Internet, which is connected via the communication interface 517.

In addition to a hard disk drive, a semiconductor storage device such as flash memory or the like can be given as a specific example of the storage device 513. The input interface 514 facilitates data transfer between the CPU 511 and an input device 518 such as a keyboard and a mouse. The display controller 515 can be connected to a display device 519, and controls displays made in the display device 519.

The data reader/writer 516 facilitates data transfer between the CPU 511 and the recording medium 520, reads out programs from the recording medium 520, and writes results of processing performed by the computer 510 into the recording medium 520. The communication interface 517 facilitates data exchange between the CPU 511 and other computers.

A generic semiconductor storage device such as CF (Compact Flash (registered trademark)), SD (Secure Digital), or the like, a magnetic storage medium such as a flexible disk or the like, an optical storage medium such as a CD-ROM (Compact Disk Read Only Memory) or the like, and so on can be given as specific examples of the recording medium 520.

The crystal orientation figure creating device 10 according to the present embodiment can also be realized using hardware corresponding to the respective units, instead of a computer in which a program is installed. Alternatively, the crystal orientation figure creating device 10 may be partially realized by a program, with the remaining parts realized by hardware. Furthermore, the crystal orientation figure creating device 10 may be formed by using a cloud server.

INDUSTRIAL APPLICABILITY

According to the present invention, it is possible to create a changed crystal orientation figure whenever necessary while measurement is conducted in a charged particle beam device such as an SEM, TEM, and SIM, using any function provided by the charged particle beam device.

REFERENCE SIGNS LIST

1. Orientation information acquiring unit
2. Incident direction information acquiring unit
3. Crystal orientation figure creating unit
4. Crystal orientation map creating unit
5. Output unit
10. Crystal orientation figure creating device
20. Main body
30. Display device
40. Input device
100. Charged particle beam device
200. SEM
300. TEM
500. Computer
M1. IPF map
M2. Kikuchi map
M3. Backscattered electron image
CB. Charged particle beam

The invention claimed is:

1. A crystal orientation figure creating device for use in a charged particle beam device for making a charged particle beam irradiated to a surface of a crystalline sample, the crystal orientation figure creating device being configured to create a crystal orientation figure, which is a figure representing a crystal coordinate system of a crystal at a position selected on the surface with respect to an incident direction of the charged particle beam, the crystal orientation figure creating device comprising:
an orientation information acquiring unit configured to acquire crystal orientation information with respect to the incident direction at the selected position;
an incident direction information acquiring unit configured to acquire information relating to an incident direction of the charged particle beam with respect to the sample; and
a crystal orientation figure creating unit configured to create a crystal orientation figure of the crystal at the selected position on the surface of the sample in a changed incident direction, based on:
the crystal orientation information acquired by the orientation information acquiring unit;
the information acquired by the incident direction information acquiring unit, the information relating to the incident direction at a time when the crystal orientation information is acquired; and
the information acquired by the incident direction information acquiring unit after the incident direction is changed, the information relating to the changed incident direction.

2. The crystal orientation figure creating device according to claim 1, further comprising:
an output unit, wherein
the output unit is configured to output the crystal orientation figure in the changed incident direction at the selected position, the crystal orientation figure being created by the crystal orientation figure creating unit, such that the crystal orientation figure is displayed on an external display device.

3. A charged particle beam device comprising the crystal orientation figure creating device according to claim 2.

4. The crystal orientation figure creating device according to claim 1, further comprising:
an output unit, wherein
the output unit is configured to output a charged particle beam image on the surface in the changed incident direction, the charged particle beam image being measured by the charged particle beam device, and the crystal orientation figure in the changed incident direction at the selected position, the crystal orientation figure being created by the crystal orientation figure creating unit, such that the charged particle beam image and the crystal orientation figure are displayed at the same time on an external display device.

5. A charged particle beam device comprising the crystal orientation figure creating device according to claim 4.

6. The crystal orientation figure creating device according to claim 1, wherein
the orientation information acquiring unit is configured to acquire pieces of crystal orientation information at a plurality of positions on the surface, and
the crystal orientation figure creating unit is configured to create crystal orientation figures at the plurality of positions.

7. A charged particle beam device comprising the crystal orientation figure creating device according to claim 6.

8. A charged particle beam device comprising the crystal orientation figure creating device according to claim 1.

9. A crystal orientation figure creating method for use in a charged particle beam device for making a charged particle beam irradiated to a surface of a crystalline sample, the crystal orientation figure creating method being for creating a crystal orientation figure, which is a figure representing a crystal coordinate system of a crystal at a position selected on the surface with respect to an incident direction of the charged particle beam, the crystal orientation figure creating method comprising:
- (a) a step of acquiring crystal orientation information with respect to the incident direction at the selected position;
- (b) a step of acquiring information relating to an incident direction of the charged particle beam with respect to the sample; and
- (c) a step of creating a crystal orientation figure of the crystal at the selected position on the surface of the sample in a changed incident direction, based on:
- the crystal orientation information acquired in the step of (a);
- the information acquired in the step of (b), the information relating to the incident direction at a time when the crystal orientation information is acquired; and
- the information acquired in the step of (b) after the incident direction is changed, the information relating to the changed incident direction.

10. The crystal orientation figure creating method according to claim 9, further comprising:
- (d) a step of outputting the crystal orientation figure in the changed incident direction at the selected position, the crystal orientation figure being created in the step of (c), such that the crystal orientation figure is displayed on an external display device.

11. The crystal orientation figure creating method according to claim 9, further comprising:
- (d) a step of outputting a charged particle beam image on the surface in the changed incident direction, the charged particle beam image being measured by the charged particle beam device, and the crystal orientation figure in the changed incident direction at the selected position, the crystal orientation figure being created in the step of (c), such that the charged particle beam image and the crystal orientation figure are displayed at the same time on an external display device.

12. The crystal orientation figure creating method according to claim 9, wherein
- in the step of (a), pieces of crystal orientation information at a plurality of positions on the surface are acquired, and
- in the step of (c), crystal orientation figures at the plurality of positions are created.

13. A non-transitory computer-readable recording medium storing a program for use in a charged particle beam device for making a charged particle beam irradiated to a surface of a crystalline sample, the program being run on a computer to create a crystal orientation figure, which is a figure representing a crystal coordinate system of a crystal at a position selected on the surface with respect to an incident direction of the charged particle beam,
the program including commands causing the computer to execute:
- (a) a step of acquiring crystal orientation information with respect to the incident direction at the selected position;
- (b) a step of acquiring information relating to an incident direction of the charged particle beam with respect to the sample; and
- (c) a step of creating a crystal orientation figure of the crystal at the selected position on the surface of the sample in a changed incident direction, based on:
- the crystal orientation information acquired in the step of (a);
- the information acquired in the step of (b), the information relating to the incident direction at a time when the crystal orientation information is acquired; and
- the information acquired in the step of (b) after the incident direction is changed, the information relating to the changed incident direction.

14. The non-transitory computer-readable recording medium according to claim 13, the program including commands further comprising:
- (d) a step of outputting the crystal orientation figure in the changed incident direction at the selected position, the crystal orientation figure being created in the step of (c), such that the crystal orientation figure is displayed on an external display device.

15. The non-transitory computer-readable recording medium according to claim 13, further comprising:
- (d) a step of outputting a charged particle beam image on the surface in the changed incident direction, the charged particle beam image being measured by the charged particle beam device, and the crystal orientation figure in the changed incident direction at the selected position, the crystal orientation figure being created in the step of (c), such that the charged particle beam image and the crystal orientation figure are displayed at the same time on an external display device.

16. The non-transitory computer-readable recording medium according to claim 13, wherein
- in the step of (a), pieces of crystal orientation information at a plurality of positions on the surface are acquired, and
- in the step of (c), crystal orientation figures at the plurality of positions are created.

* * * * *